(12) United States Patent
Song et al.

(10) Patent No.: US 7,589,374 B2
(45) Date of Patent: Sep. 15, 2009

(54) SEMICONDUCTOR DEVICE AND RELATED FABRICATION METHOD

(75) Inventors: Jai-Hyuk Song, Seoul (KR); Jeong-Hyuk Choi, Seongnam-si (KR); Woon-Kyung Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 142 days.

(21) Appl. No.: 11/699,990

(22) Filed: Jan. 31, 2007

(65) Prior Publication Data

US 2007/0190726 A1 Aug. 16, 2007

(30) Foreign Application Priority Data

Feb. 15, 2006 (KR) .................. 10-2006-0014784

(51) Int. Cl.
*H01L 29/788* (2006.01)
(52) U.S. Cl. .................. 257/315; 438/257
(58) Field of Classification Search ............ 438/201, 438/211, 257–259, 261, 267, 294, 296, 424; 257/315, 321, E21.68
See application file for complete search history.

(56) References Cited

U.S. PATENT DOCUMENTS 4,634,645 A 1/1987 Matsuda et al.

6,559,008 B2 * 5/2003 Rabkin et al. ............... 438/257
2003/0068860 A1 4/2003 Rabkin et al.
2005/0212034 A1 9/2005 Sasago et al.

FOREIGN PATENT DOCUMENTS

| JP | 10-032190 | 2/1998 |
| JP | 2003007869 A | 1/2003 |
| JP | 2004-022819 | 1/2004 |
| JP | 2005-101066 | 4/2005 |
| KR | 1020010036044 A | 5/2001 |
| KR | 1020030029032 A | 4/2003 |
| KR | 1020060068223 A | 6/2006 |

* cited by examiner

*Primary Examiner*—David Vu
(74) *Attorney, Agent, or Firm*—Volentine & Whitt, PLLC

(57) ABSTRACT

Embodiments of the invention provide a semiconductor device and a related method of fabricating a semiconductor device. In one embodiment, the invention provides a semiconductor device comprising a first gate electrode comprising a lower silicon pattern and an upper silicon pattern and disposed on an active region of a semiconductor substrate, wherein the upper silicon pattern has the same crystal structure as the lower silicon pattern and the active region is defined by a device isolation layer. The semiconductor device further comprises a gate insulating layer disposed between the active region and the first gate electrode.

11 Claims, 17 Drawing Sheets

SEMICONDUCTOR DEVICE AND RELATED FABRICATION METHOD

BACKGROUND

1. Field of the Invention

Embodiments of the invention relate to a semiconductor device and a related fabrication method. In particular, embodiments of the invention relate to a semiconductor device comprising a gate electrode comprising upper and lower silicon patterns, wherein the upper silicon pattern has the same crystal structure as a lower silicon pattern, and a related method of fabrication.

This application claims priority to Korean Patent Application No. 2006-14784, filed on Feb. 15, 2006, the subject matter of which is hereby incorporated by reference in its entirety.

2. Description of Related Art

In general, a semiconductor memory device can be classified as a volatile memory device or a nonvolatile memory device. Volatile memory devices, such as dynamic random access memory (DRAM) devices and static random access memory (SRAM) devices, have relatively high data input and output speeds; however, data stored in a volatile memory device is lost when the power supplied to the device is turned OFF. On the other hand, a nonvolatile memory device, such as a flash memory device, is able to maintain the data stored in the device even when the power supplied to the device is turned OFF. Volatile and nonvolatile semiconductor memory devices each include multiple transistors.

Figure (FIG.) 1 is a schematic cross-sectional view of a conventional MOS transistor. Referring to FIG. 1, a gate insulating layer 30 and a gate electrode 40 are disposed on an active region 15 of a semiconductor substrate 10. Active region 15 is defined by a device isolation layer 20.

As a design rule decreases, an aspect ratio of gate electrode 40 increases, so the likelihood that defects such as voids were generated inside gate electrode 40 when it was formed becomes relatively high.

FIGS. 2 and 3 are schematic cross-sectional views of a conventional non-volatile memory device. Referring to FIG. 2, device isolation layer 20, which defines active region 15, is disposed on a predetermined region of semiconductor substrate 10. A floating gate electrode 40 is disposed on active region 15, and gate insulating layer 30 is disposed between floating gate electrode 40 and active region 15. A control gate electrode 60 is disposed on active region 15, device isolation layer 20, and floating gate electrode 40. In addition, a gate insulating layer 50 is disposed between floating gate electrode 40 and control gate electrode 60. Control gate electrode 60 is used as a word line for selecting a predetermined cell of a cell array having a plurality of memory cells.

Referring to FIG. 2, surfaces of floating gate electrode 40 and control gate electrode 60 face each other with gate insulating layer 50 interposed between those surfaces. A coupling ratio between floating gate electrode 40 and control gate electrode 60 is proportional to the area of the surfaces of electrodes 40 and 60 facing each other. Since a width d1 of floating gate electrode 40 and an interval d2 between floating gate electrodes 40 should be reduced in order to achieve a high degree of integration in the device of FIG. 2, the respective heights of floating gate electrodes 40 should be increased in order to increase the area of the surfaces facing one another (i.e., to increase the coupling ratio). However, increasing the respective heights of floating gate electrodes 40 may cause electrical interference to be generated because increasing the respective heights of floating gate electrodes 40 increases the respective areas of the surfaces of adjacent floating gate electrodes 40 that face one another and increases the respective areas of the surfaces of a floating gate electrode 40 and a control gate electrode 60 (i.e., a word line) that face one another. The generation of electrical interference is a problem because electrical interference may change data stored in a memory cell.

A proposed solution to the problems discussed above is using a floating gate electrode having a "T"-shaped cross-section. Referring to FIG. 3, floating gate electrode 41 includes a lower polysilicon pattern 42 and an upper polysilicon pattern 44. The height of floating gate electrode 41 of FIG. 3 is greater than the height of floating gate electrode 40 of the memory device illustrated in FIG. 2, but upper polysilicon pattern 44 is narrower than lower polysilicon pattern 42, and an interval between adjacent upper polysilicon patterns 44 is relatively large, which can reduce electrical interference. However, many problems may occur when forming the memory device illustrated in FIG. 3.

FIGS. 4A and 4B are cross-sectional views illustrating a method for forming the conventional nonvolatile memory device illustrated in FIG. 3.

Referring to FIGS. 4A and 4B, a device isolation layer 20 defining an active region 15 is formed on a semiconductor substrate having a cell region A and a peripheral region B. Gate insulating layers 30 and 35 and lower polysilicon patterns 42 and 47 are formed on active region 15. Molding spacers 75 covering edges of upper surfaces of lower polysilicon patterns 42 and 47 are formed adjacent to upper sidewalls of device isolation layer 20. Upper polysilicon patterns 44 and 49 are formed on portions of lower polysilicon patterns 42 and 47 that are exposed between molding spacers 75. Thus, a floating gate electrode 41 is formed in cell region A, and a peripheral circuit gate pattern 45 is formed in peripheral region B. Because an interval between molding spacers 75 in cell region A is relatively narrow, upper polysilicon pattern 44 may not be formed uniformly. For example, defects such voids may be generated inside upper polysilicon pattern 44 when it is formed. As a design rule decreases, the problem just described may occur frequently. In addition, because an interval between pillar-shaped spacers 75 in peripheral region B is large, upper polysilicon pattern 49 is formed having a "U" shape. That is, edge portions of upper polysilicon pattern 49 are thicker than a central portion of upper polysilicon pattern 49.

Referring to FIG. 4B, after device isolation layer 20 is etched (i.e., recessed), a preliminary gate insulating layer 51 (not shown) and a control gate conductive layer 61 (not shown) are formed on semiconductor substrate 10. Subsequently, an etching process for patterning control gate conductive layer 61 and preliminary gate insulating layer 51 is performed to form a control gate electrode and an inter-gate insulating layer. While the etching process is performed, lower polysilicon pattern 47 in peripheral region B may be etched excessively and thus active region 15 may be etched (i.e., pits may be formed in active region 15). That is, because the edge portions of upper polysilicon pattern 49 are thicker than the central portion of upper polysilicon pattern 49, when upper polysilicon pattern 49 is etched, the central portion of upper polysilicon pattern 49 is etched away completely before the edge portions of upper polysilicon pattern 49 are etched away completely. Accordingly, a portion of lower polysilicon pattern 47 disposed under the central portion of upper polysilicon pattern 49 may be excessively etched, and thus active region 15 disposed under the etched portion of lower polysilicon pattern 47 may be etched (i.e., pits may be formed in that active region 15).

The problems described above may negatively affect an operational characteristic(s) and the reliability of a semiconductor device.

SUMMARY OF THE INVENTION

Embodiments of the invention provide a semiconductor device having a relatively high degree of integration and improved reliability, and a method for fabricating the semiconductor device.

In one embodiment, the invention provides a semiconductor device comprising a first gate electrode comprising a lower silicon pattern and an upper silicon pattern and disposed on an active region of a semiconductor substrate, wherein the upper silicon pattern has the same crystal structure as the lower silicon pattern and the active region is defined by a device isolation layer. The semiconductor device further comprises a gate insulating layer disposed between the active region and the first gate electrode.

In another embodiment, the invention provides a semiconductor device comprising a memory cell transistor disposed in a cell region of a semiconductor substrate. The memory cell transistor comprises a floating gate electrode disposed on a first active region of the semiconductor substrate and comprising a first lower silicon pattern and a first upper silicon pattern, wherein the first upper silicon pattern has the same crystal structure as the first lower silicon pattern and the first active region is defined by a device isolation layer. The memory cell transistor further comprises a first gate insulating layer disposed between the first active region and the floating gate electrode; a control gate electrode disposed on the floating gate electrode, the first active region, and the device isolation layer; and an inter-gate insulating layer disposed between the floating gate electrode and the control gate electrode. The semiconductor device further comprises a peripheral circuit transistor disposed in a peripheral region of the semiconductor substrate. The peripheral circuit transistor comprises a peripheral circuit gate electrode disposed on a second active region of the semiconductor substrate and comprising a second lower silicon pattern and a second upper silicon pattern, wherein the second upper silicon pattern has the same crystal structure as the second lower silicon pattern. The peripheral circuit transistor further comprises a second gate insulating layer disposed between the second active region and the peripheral circuit gate electrode.

In yet another embodiment, the invention provides a method for forming a semiconductor device, the method comprising forming a gate electrode on a semiconductor substrate by forming a lower silicon pattern on the semiconductor substrate, forming a device isolation layer having an upper surface disposed higher than the upper surface of the lower silicon pattern, and growing an upper silicon pattern from the lower silicon pattern through selective epitaxial growth. The method further comprises forming a source/drain region on a first side of the gate electrode and in an active region of the semiconductor substrate.

In still another embodiment, the invention provides a method for forming a semiconductor device, the method comprising forming a floating gate electrode in a cell region of a semiconductor substrate and a peripheral circuit gate electrode in a peripheral region of the semiconductor substrate by forming first and second lower silicon patterns on a semiconductor substrate, wherein the first lower silicon pattern is formed in the cell region and the second lower silicon pattern is formed in the peripheral region; and growing first and second upper silicon patterns from the first and second lower silicon patterns, respectively, through selective epitaxial growth. The method further comprises etching a device isolation layer, sequentially forming a preliminary inter-gate insulating layer and a control gate conductive layer on the semiconductor substrate; and patterning at least one portion of the control gate conductive layer disposed in the peripheral region and at least one portion of the preliminary inter-gate insulating layer disposed in the peripheral region to form a control gate electrode and an inter-gate insulating layer.

BRIEF DESCRIPTION OF THE DRAWINGS

Embodiments of the invention will be described herein with reference to the accompanying drawing, in which like reference symbols indicate like or similar elements throughout. In the drawings, thicknesses of layers and regions may be exaggerated for clarity. In the drawings.

DESCRIPTION OF EMBODIMENTS

Although the terms "first" and "second" are used herein in the names of elements, these terms are used in this manner only to differentiate between similarly-named elements and thus are interchangeable. Also, when a first element is referred to as being "on," "over," etc., (including "disposed on," "disposed over," "formed on," etc.) a second element, the first element may be directly on the second element or intervening elements (e.g., layers, etc.) may be present. In addition, although a plurality of an element may be shown in a drawing, for convenience of description, the description of the illustrated embodiment may mention only one such element. Also, an active region may be described herein as being defined by trenches and/or a corresponding device isolation layer.

In addition, silicon patterns described in the specification may be single crystal silicon or polycrystal silicon. Therefore, as used herein, "selective epitaxial growth" may indicate growing polycrystal silicon from other polycrystal silicon or growing polycrystal silicon from single crystal silicon.

The structure of semiconductor devices, in accordance with embodiments of the invention, will now be described.

Figure 1:
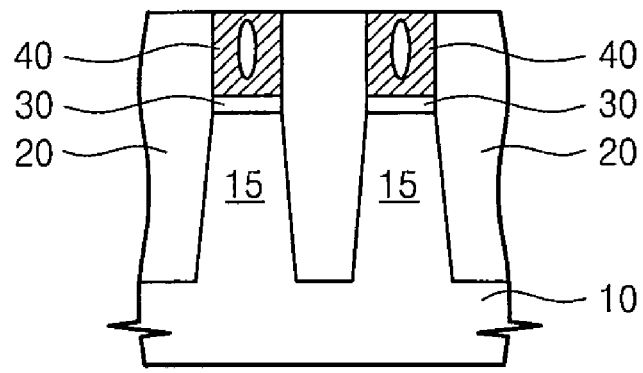
FIG. 1 is a schematic cross-sectional view of a conventional MOS transistor.
Figure 2:
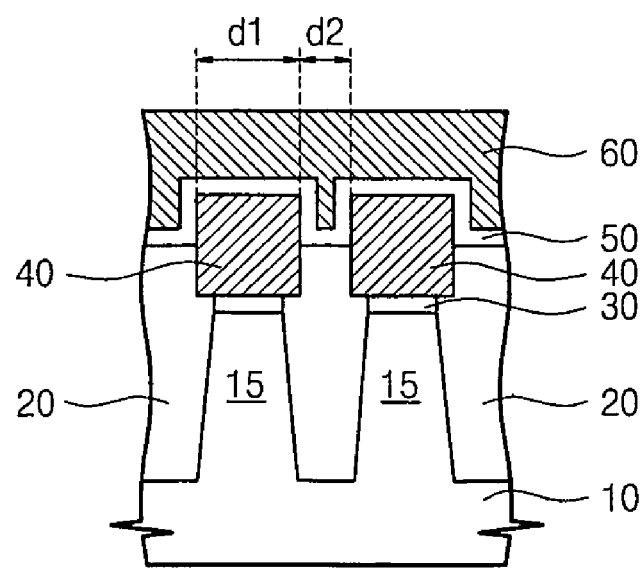
FIGS. 2 and 3 are schematic cross-sectional views of another conventional nonvolatile memory device.
Figure 3:
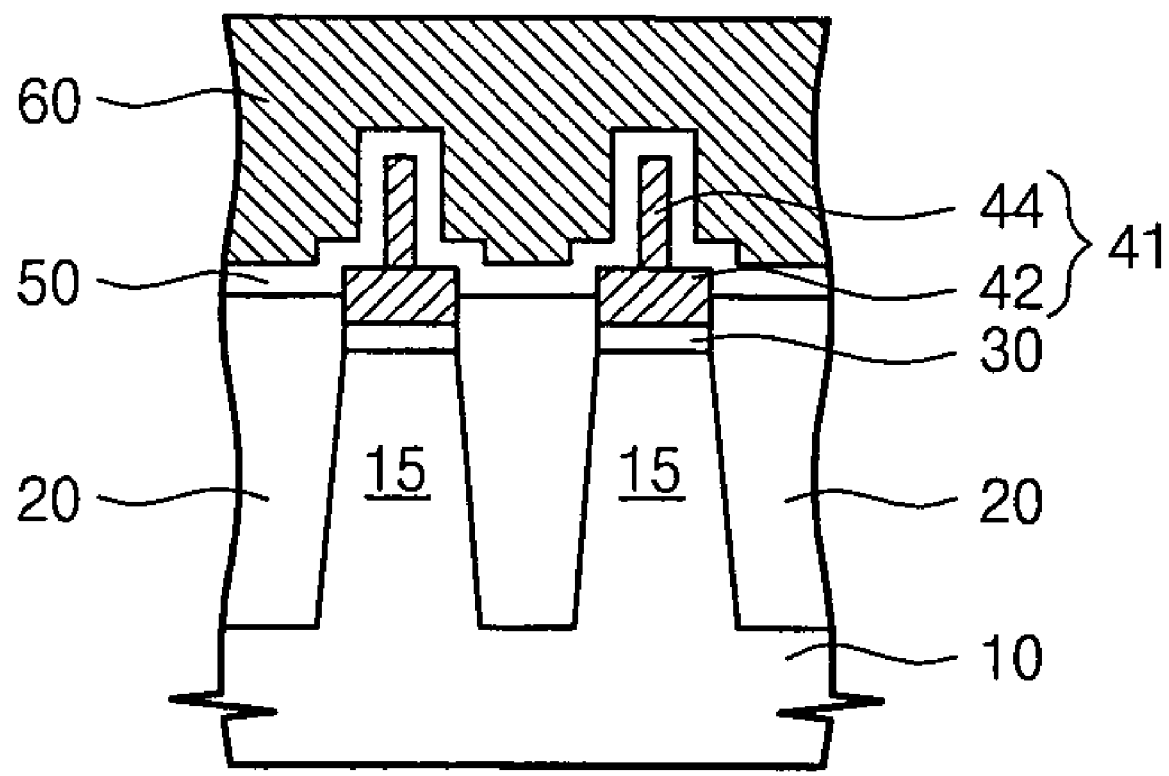
Figure 4A:
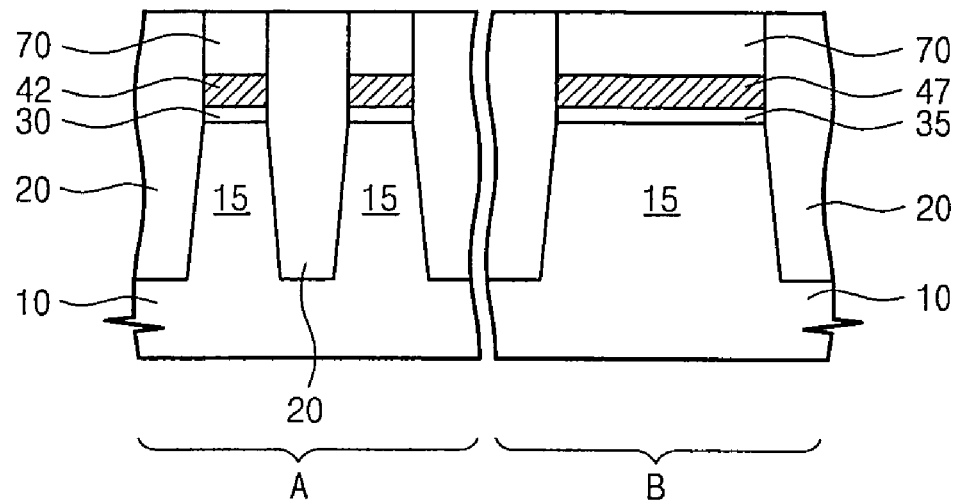
FIGS. 4A and 4B are cross-sectional views illustrating a method for forming the non-volatile memory device illustrated in FIG. 3.
Figure 4B:
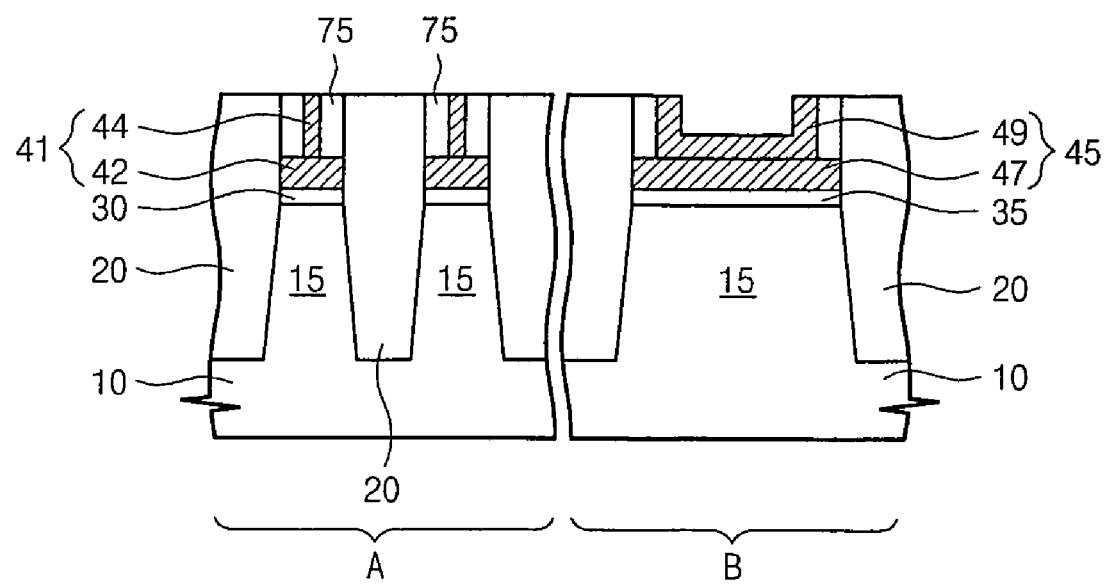
Figure 5:
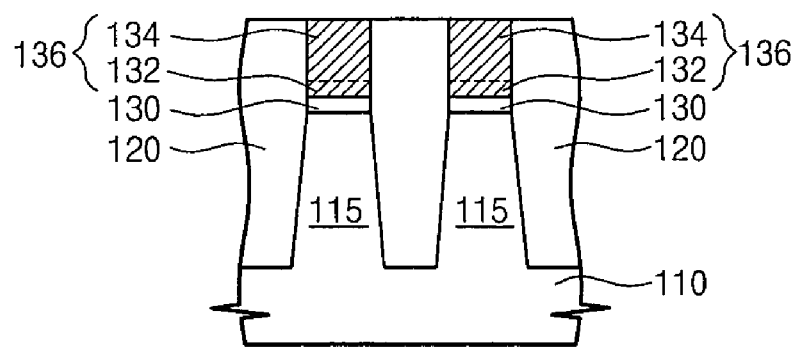
FIG. 5 is a schematic cross-sectional view of a semiconductor device in accordance with an embodiment of the invention.

FIG. 5 is a schematic cross-sectional view of a semiconductor device in accordance with an embodiment of the invention. FIG. 5 illustrates, as an example in accordance with an embodiment of the invention, a semiconductor device comprising a MOS transistor. Referring to FIG. 5, a device isolation layer 120 defining an active region 115 is disposed in a predetermined region of a semiconductor substrate 110. A gate electrode 136 is adjacent to upper sidewalls of portions of device isolation layer 120 and is disposed on active region 115. A gate insulating layer 130 is disposed between active region 115 and gate electrode 136. In addition, source/drain regions (not shown) are respectively disposed on two sides of gate electrode 136 and in an active region 115.

Gate electrode 136 comprises a lower silicon pattern 132 and an upper silicon pattern 134 formed from lower silicon pattern 132 through selective epitaxial growth. Since upper silicon pattern 134 is grown from lower silicon pattern 132 (i.e., through selective epitaxial growth), upper silicon pattern 134 has the same crystal structure as that of lower silicon pattern 132. In addition, upper silicon pattern 144 may be thicker than lower silicon pattern 132.

In the embodiment illustrated in FIG. 5, gate electrode 136 may be formed with fewer defects such as voids generated inside of gate electrode 136, even when a distance between device isolation layers 120 (i.e., a width of gate electrode 136) is reduced due to the reduction of a design rule. Also, gate electrode 136 can have a uniform crystal structure even when an aspect ratio increases.

Figure 6:
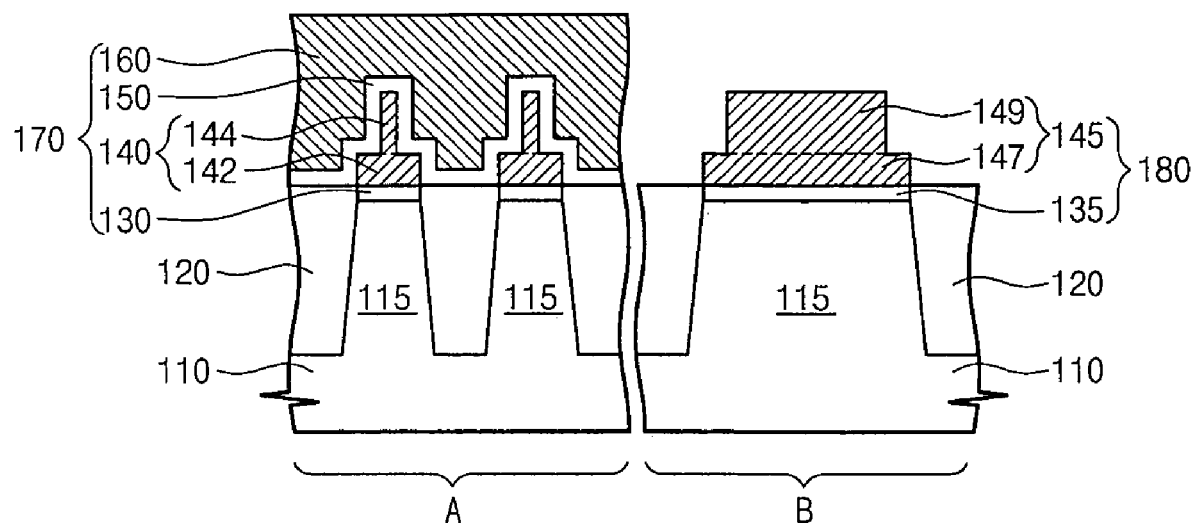
FIG. 6 is a schematic cross-sectional view of a semiconductor device in accordance with another embodiment of the invention.

FIG. 6 is a schematic cross-sectional view of a semiconductor device in accordance with another embodiment of the invention. FIG. 6 illustrates, as an example in accordance with an embodiment of the invention, a flash memory device. Referring to FIG. 6, a device isolation layer 120 defining first and second active regions 115 disposed on a semiconductor substrate 110 comprising a cell region A and a peripheral region B.

A memory cell transistor 170 is disposed in cell region A, and a peripheral circuit transistor 180 is disposed in peripheral region B. Memory cell transistor 170 comprises a gate insulating layer 130, a floating gate electrode 140, an inter-gate insulating layer 150, and a control gate electrode 160, which are sequentially stacked on first active region 115.

Peripheral circuit transistor 180 comprises a gate insulating layer 135 and a peripheral circuit gate electrode 145, which are sequentially stacked on second active region 115. Also, source/drain regions (not shown) are disposed in portions of each of first and second active regions 115. Source/drain regions are disposed on two sides of floating gate electrode 140 and on two sides of peripheral circuit gate electrode 145.

Gate insulating layers 130 and 135 are used as tunneling insulating layers through which charge moves when a relatively high electric field is applied between control gate electrode 160 and a channel region of semiconductor substrate 110. Gate insulating layers 130 and 135 may be, for example, silicon oxide layers. Inter-gate insulating layer 150 prevents charges injected into floating gate electrode 140 from the channel region from moving to control gate electrode 160 during a program operation. Inter-gate insulating layer 150 may be, for example, an oxide layer, a nitride layer, or a multiple layer comprising a combination thereof. That is, inter-gate insulating layer 150 may have an oxide layer-nitride layer-oxide layer multiple-layer structure. Also, inter-gate insulating layer 150 may be formed from a material such as aluminum oxide having a relatively high dielectric constant in order to achieve a relatively high coupling ratio between floating gate electrode 140 and control gate electrode 160. Control gate electrode 160 extends over first active region 115 and device isolation layer 120 and is used as a word line. As an example, control gate electrode 160 can be formed from silicon or a multi-layered structure comprising silicon and a silicide material (which may be referred to hereafter simply as "silicide"). Floating gate electrodes 140 isolated from one another in a word line direction by device isolation layer 120 are controlled by the same control gate electrode 160. However, floating gate electrodes 140 disposed along a bit line direction (which extends directly into the page of FIG. 6, for example), that is, floating gate electrodes 140 formed on the same first active region 115, are each controlled by a different control gate electrode 160.

Floating gate electrode 140 is used as a charge-storing element and comprises a first lower silicon pattern 142 and a first upper silicon pattern 144. Peripheral circuit gate electrode 145 comprises a second lower silicon pattern 147 and a second upper silicon pattern 149. First and second upper silicon patterns 144 and 149 are grown from first and second lower silicon patterns 142 and 147, respectively, through selective epitaxial growth. Thus, first upper silicon pattern 144 has the same crystal structure as first lower silicon pattern 142 and second upper silicon pattern 149 has the same crystal structure as second lower silicon pattern 147. In the embodiment illustrated in FIG. 6, floating gate electrode 140 has an inverse-"T"-shaped cross-section, but floating gate electrode 140 is not limited to having such a cross-section. The cross-section of floating gate electrode 140 can have any one of various shapes.

In FIG. 6, first lower silicon pattern 142 is illustrated as having the same width as first active region 115, on which it is formed, and second lower silicon pattern 147 is illustrated as having the same width as second active region 115, on which it is formed. However, first and second lower silicon patterns 142 and 147 are not limited to those widths. That is, each of first and second lower silicon patterns 142 and 147 may be wider than the active region 115 on which it is formed. If each of first and second lower silicon patterns 142 and 147 has a width that is equal to the width of the active region 115 on which it is formed, the degree of integration of the semiconductor device illustrated in FIG. 6 benefits. When each of first and second lower silicon patterns 142 and 147 is wider than the active region 115 on which it is formed, first lower silicon pattern 142 can protect gate insulating layer 130 from etching damage when forming the semiconductor device comprising those elements, so a lower surface of control gate electrode 160 can be formed lower than a lower surface of floating gate electrode 140. Accordingly, a coupling ratio between floating gate electrode 140 and control gate electrode 160 can be increased.

First lower silicon pattern 142 may be wider than first upper silicon pattern 144, and second lower silicon pattern 147 may be as wide as or wider than second upper silicon pattern 149. Also, first upper silicon pattern 144 may be thicker than first lower silicon pattern 142, and second upper silicon pattern 149 may be thicker than second lower silicon pattern 147. As used herein, the "width" of an element is the size of the element along a dimension that is substantially parallel to the working surface of the substrate on which it is formed and extends horizontally between left and right sides of the drawing in which the element is illustrated. In addition, as used herein, the "thickness" of an element is the size of the element along a dimension that is substantially perpendicular to the working surface of the substrate on which it is formed. Also, the terms "horizontal" and "vertical" are orthogonal dimensions interpreted with respect to the orientation of the structure being described, as illustrated in the drawing being referred to when the structure is being described. As used herein, "vertical" means a dimension substantially perpendicular to the working surface of a substrate as illustrated, and "horizontal" means a dimension substantially parallel to the working surface of the substrate as illustrated and extending between left and right sides of the drawing. In addition, as used herein, terms such as "higher," "upper," and "lower" are relative terms corresponding to the vertical direction.

As the thickness of first upper silicon pattern 144 increases, a coupling ratio between floating gate electrode 140 and control gate electrode 160 increases, but electrical interference is generated between first upper silicon pattern 144 and an adjacent floating gate electrode 140, which may cause the semiconductor device comprising first upper silicon pattern 144 to malfunction. Therefore, first upper silicon pattern 144 is preferably formed having a relatively small width and a relatively large thickness. In the embodiment illustrated in FIG. 6, it is possible to form first upper silicon pattern 144 with a relatively small and a relatively large thickness by forming first upper silicon pattern 144 using a selective epitaxial growth process.

In addition, second upper silicon pattern 149 may be formed on second lower silicon pattern 147 without having to perform a separate, additional process. Second upper silicon pattern 149 can substantially prevent pits from being etched into a portion of second active region 115 disposed below second lower silicon pattern 147 as a result of second active region 115 being etched after second lower silicon pattern 147 is excessively etched during an etching process performed in forming control gate electrode 160.

In the embodiment illustrated in FIG. 6, the semiconductor device of FIG. 6 may also comprise buffer insulating layer patterns (not shown) disposed between upper surfaces of first lower silicon pattern 142 and inter-gate insulating layer 150, and buffer spacers (not shown) disposed between sidewalls of first lower silicon pattern 142 and inter-gate insulating layer 150. The buffer insulating layer patterns are designed to prevent first lower silicon pattern 142 from being damaged by etching, and the buffer spacer is designed to prevent gate insulating layer 130 from being damaged by etching. The formation of the buffer insulating layer patterns and the buffer spacers will be described subsequently when a method for forming a semiconductor device in accordance with an embodiment of the invention is described.

Figure 7:
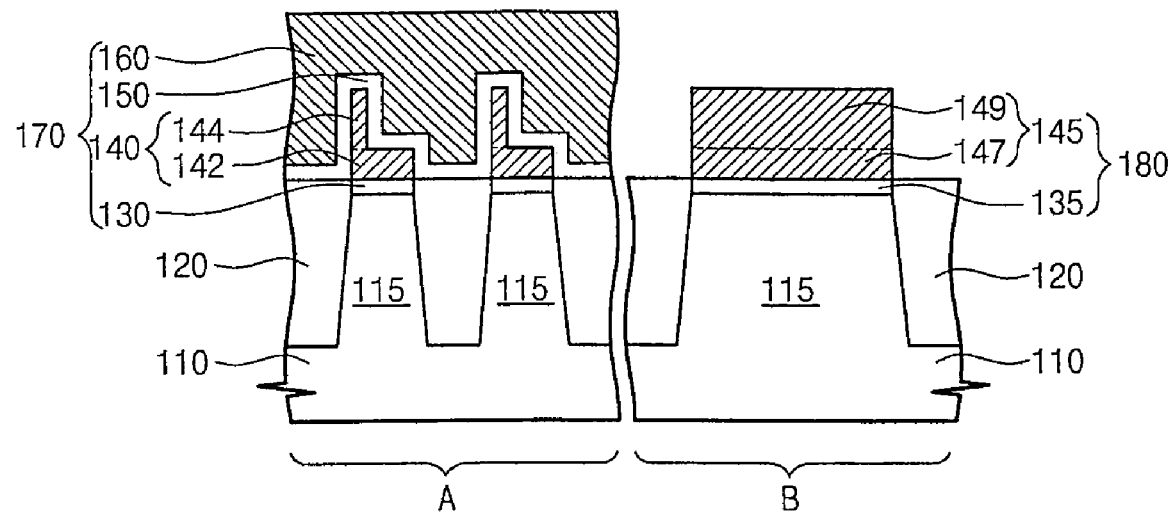
FIG. 7 is a schematic cross-sectional view of a semiconductor device in accordance with another embodiment of the invention.

FIG. 7 is a schematic cross-sectional view of a semiconductor device in accordance with another embodiment of the invention. Elements of the embodiment illustrated in FIG. 7 that are the same as or similar to elements of the embodiment illustrated in FIG. 6 will not be described again with reference to FIG. 7. Rather, differences between the embodiments of FIGS. 6 and 7 will be described with reference to FIG. 7.

Referring to FIG. 7, unlike in the embodiment illustrated in FIG. 6, floating gate electrode 140 has a cross-section that has an "⌐"-shape (and other floating gate electrodes 140 of the semiconductor device illustrated in FIG. 7 may have a "⌐"-shape). First upper silicon pattern 144 is disposed on one side of an upper surface of first lower silicon pattern 142. Thus, as illustrated in FIG. 7, for two floating gate electrodes 140 that are adjacent to one another in a word line direction (i.e., referring to FIG. 7, a direction substantially parallel to the working surface of the substrate and extending between left and right sides of the drawing) like the two floating gate electrodes 140 illustrated in FIG. 7, an area of a surface of a first floating gate electrode 140 (illustrated on the left-hand side of FIG. 7) nearest to and facing a second floating gate electrode 140 (illustrated on the right-hand side of FIG. 7) is relatively small, and an area of a surface of second floating gate electrode 140 nearest to and facing first floating gate electrode 140 is relatively large. That is, the side of first floating gate electrode 140 nearest to and facing second floating gate electrode 140 comprises a side of only first lower silicon pattern 142 of first floating gate electrode 140, and the side of second floating gate electrode 140 nearest to and facing first floating gate electrode 140 comprises both a side of first lower silicon pattern 142 and a side of first upper silicon pattern 144 of second floating gate electrode 140. Formed in this manner, parasitic capacitance between adjacent floating gate electrodes 140 adjacent in a word line direction can be reduced and a coupling ratio between floating gate electrodes 140 and control gate electrode 160 can be increased. In FIG. 7, first upper silicon pattern 144 is disposed on a first side of floating gate electrode 140 forming an "⌐"-shape. However, when first upper silicon pattern 144 is disposed on a second side of floating gate electrode 140 opposite the first side, floating gate electrode 140 forms a "⌐"-shape. Also in the embodiment illustrated in FIG. 7 (though not shown), floating gate electrodes 140 disposed adjacent to one another along the direction of a first active region 115 on which they are disposed (that is, along a direction substantially parallel to the working surface of the substrate and extending into the page of FIG. 7) alternate between floating gate electrodes 140 having the "⌐"-shape and floating gate electrodes 140 having the "⌐"-shape so that parasitic capacitance can be minimized between floating gate electrodes 140 adjacent in the direction of the first active region 115.

Referring to FIG. 7, the width of second upper silicon pattern 149 is equal to the width of second lower silicon pattern 147. Therefore, second upper silicon pattern 149 can more effectively prevent pits from being etched into a portion of second active region 115 disposed below second lower silicon pattern 147 after second lower silicon pattern 147 is excessively etched during an etching process performed in forming control gate electrode 160.

A method for forming a semiconductor device in accordance with an embodiment of the invention will now be described.

FIGS. 8A through 8E are cross-sectional views illustrating a method for forming a semiconductor device in accordance with another embodiment of the invention. FIGS. 8A through 8E illustrate, as an example in accordance with an embodiment of the invention, the formation of a MOS transistor.

Figure 8A:
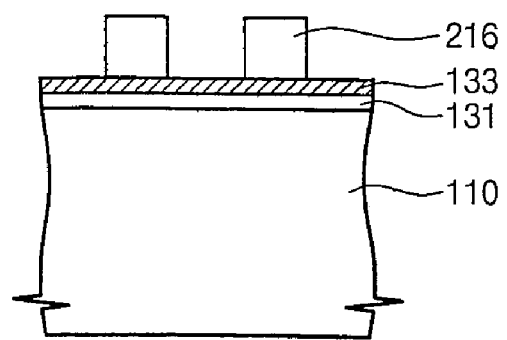
FIGS. 8A through 8E are cross-sectional views illustrating a method for forming a semiconductor device in accordance with another embodiment of the invention.

Referring to FIG. 8A, a preliminary gate insulating layer 131, a lower silicon layer 133, and a trench mask 216 are formed on a semiconductor substrate 110. Preliminary gate insulating layer 131, lower silicon layer 133, and trench mask 216 can be formed through a well-known thin film forming process. In addition, preliminary gate insulating layer 131 can be formed from a silicon oxide material (which may be referred to hereafter as simply "silicon oxide"), lower silicon layer 133 can be formed from single crystal silicon or polycrystal silicon, and trench mask 216 can be formed from a silicon nitride material (which may be referred to hereafter as simply "silicon nitride").

Figure 8B:
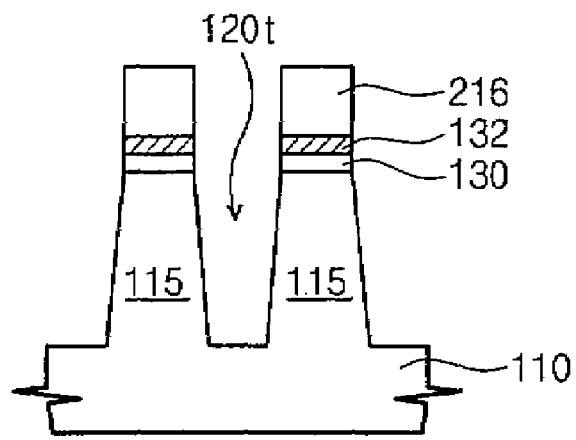

Referring to FIG. 8B, trenches 120t defining an active region 115 are formed in semiconductor substrate 110 by performing an etching process on semiconductor substrate 110 using trench mask 216 as an etch mask. The etching process also forms a gate insulating layer 130 and a lower silicon pattern 132 disposed on active region 115.

Figure 8C:
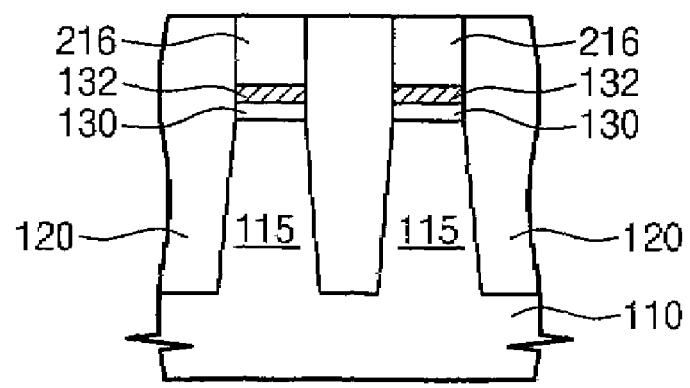

Referring to FIG. 8C, after a preliminary device isolation layer filling trenches 120*t* is formed, a planarization process for exposing an upper surface of trench mask 210 is performed to form a device isolation layer 120.

Figure 8D:
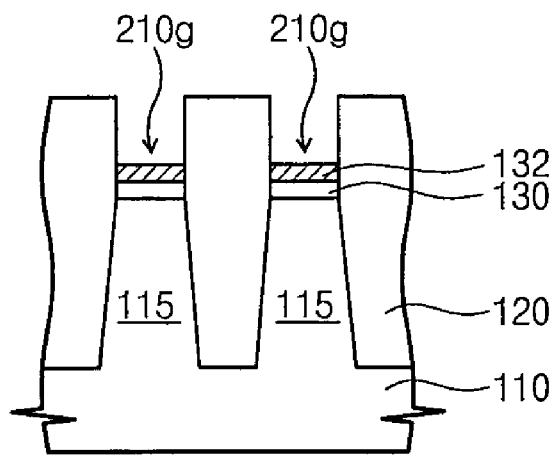

Referring to FIG. 8D, an etching process is performed to remove trench mask 216 and to form a gap region 210*g* exposing lower silicon pattern 132. An upper surface of lower silicon pattern 132 is disposed lower than an upper surface of device isolation layer 120. In the etching process for removing trench mask 216, trench mask 216 is selectively removed using an etching recipe having etching selectivity between trench mask 216 and device isolation layer 120, and gap region 210*g* is formed uniformly. Therefore, trench mask 216 and device isolation layer 120 may respectively be formed from materials having etching selectivities relative to one another. For example, trench mask 216 may be formed from silicon nitride, and device isolation layer 120 may be formed from silicon oxide.

Figure 8E:
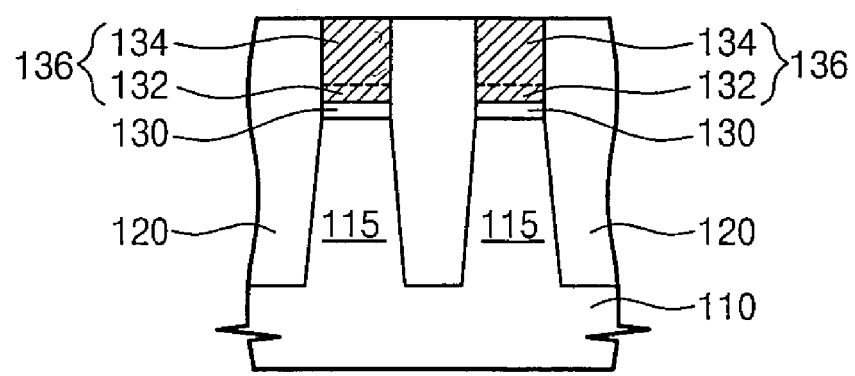

Referring to FIG. 8E, after a preliminary upper silicon pattern filling gap region 210*g* is formed by growing the preliminary upper silicon pattern from the lower silicon pattern 132 through selective epitaxial growth, a planarization process for exposing an upper surface of device isolation layer 120 is performed to form an upper silicon pattern 134. Once upper silicon pattern 134 is formed, a gate electrode 136 comprising lower silicon pattern 132 and upper silicon pattern 134 has been formed. Subsequently, a transistor is completed once source/drain regions (not shown) are respectively formed on two sides of gate electrode 136 and in an active region 115.

In accordance with the embodiment illustrated in FIGS. 8A through 8E, a gate electrode can be formed with fewer defects such as voids being formed inside gate electrode as it is formed, even when a design rule decreases. That is, a gate electrode having a relatively high aspect ratio (i.e., having a relatively large thickness and a relatively small width) can be uniformly formed.

FIGS. 9A through 9G are cross-sectional views illustrating a method for forming a semiconductor device in accordance with another embodiment of the invention. FIGS. 9A through 9G illustrate, as an example in accordance with an embodiment of the invention, the formation of a flash memory device.

Figure 9A:
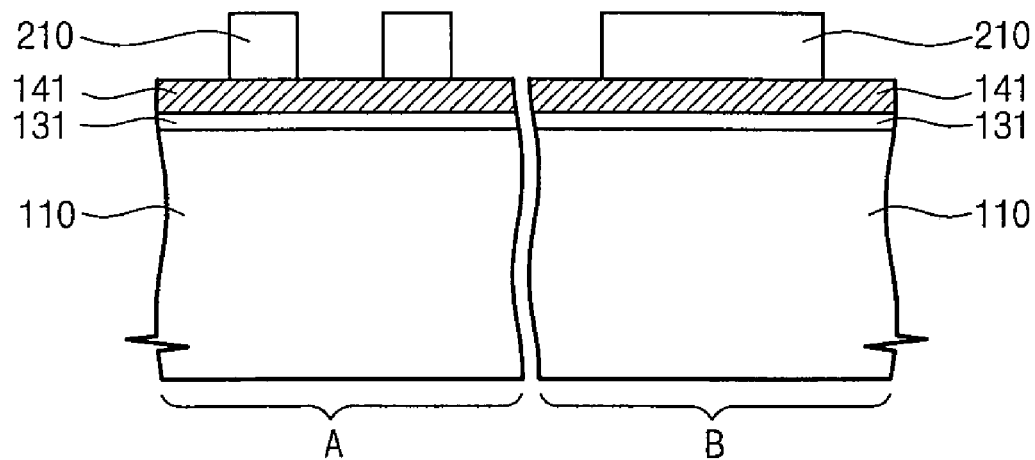
FIGS. 9A through 9G are cross-sectional views illustrating a method for forming a semiconductor device in accordance with another embodiment of the invention.

Referring to FIG. 9A, a preliminary gate insulating layer 131, a lower silicon layer 141, and a trench mask 210 are formed on a semiconductor substrate 110 comprising a cell region A and a peripheral region B. Preliminary gate insulating layer 131, lower silicon layer 141, and trench mask 210 can be formed through a well-known thin film forming process. In addition, preliminary gate insulating layer 131 can be formed from silicon oxide, lower silicon layer 141 can be formed from single crystal silicon or polycrystal silicon, and trench mask 210 can be formed from silicon nitride.

Figure 9B:
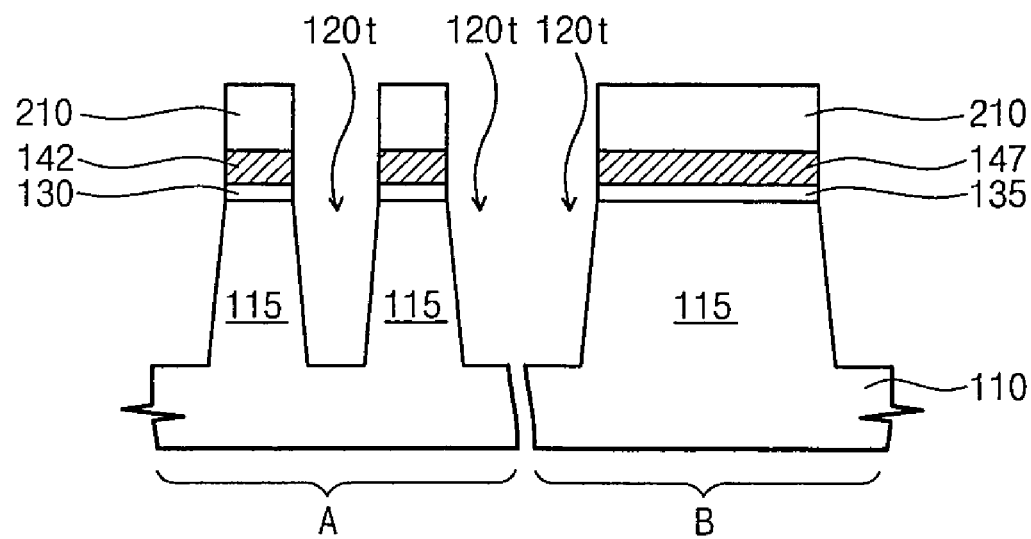

Referring to FIG. 9B, trenches 120*t* defining first and second active regions 115 are formed in semiconductor substrate 110 by performing an etching process on semiconductor substrate 110 using trench mask 210 as an etch mask. The etching process also forms a first gate insulating layer 130 and a first lower silicon pattern 142 disposed on a first active region 115 disposed in cell region A, and forms a second gate insulating layer 135 and a second lower silicon pattern 147 disposed on a second active region 115 disposed in peripheral region B.

Figure 9C:
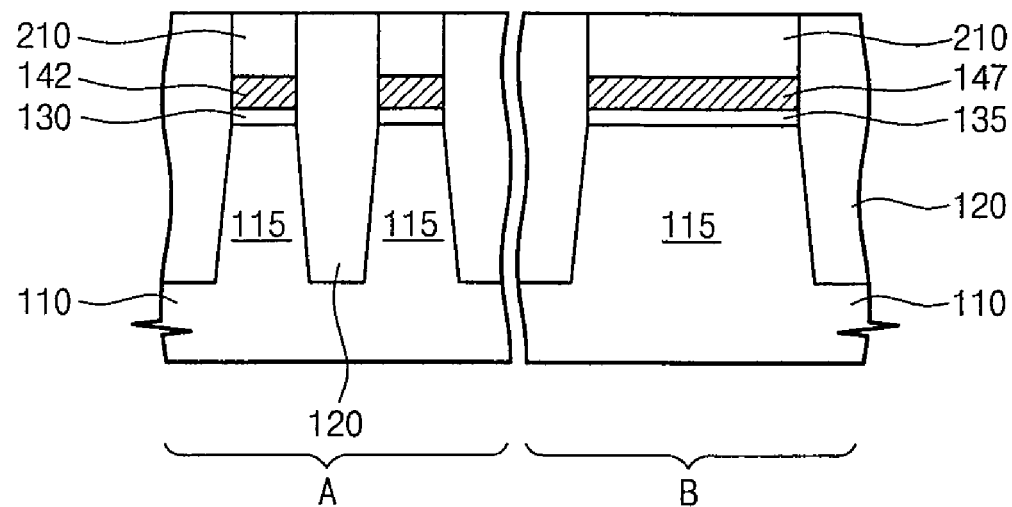

Referring to FIG. 9C, after a preliminary device isolation layer filling trenches 120*t* are formed, a planarization process for exposing an upper surface of trench mask 210 is performed in order to form a device isolation layer 120.

Device isolation layer 120 may be formed from silicon oxide through a well-known thin film forming process. Before the formation of device isolation layer 120, a thermal oxide layer (not shown) may be formed on semiconductor substrate 110 in order to substantially remedy etching damage caused to portions of semiconductor substrate 110 forming inner walls of trenches 120*t* when the etching process for forming trenches 120*t* was performed. Also, a liner layer (not shown) for preventing impurities from penetrating into first and second active regions 115 may be formed on the thermal oxide layer.

The planarization process may be performed using a chemical mechanical polishing (CMP) technology that uses slurry having etching selectivity between the preliminary device isolation layer and trench mask 210.

Figure 9D:
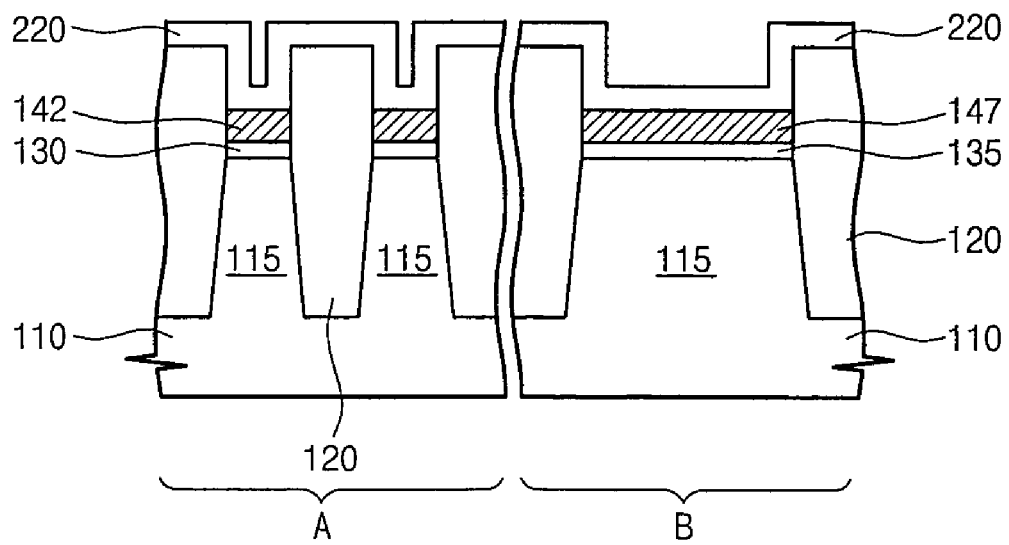

Referring to FIG. 9D, after trench mask 210 is removed by performing an etching process, a molding layer 220 is formed on semiconductor substrate 110. During the etching process for removing trench mask 210, trench mask 210 may be selectively removed using an etching recipe having etching selectivity between trench mask 210 and device isolation layer 120. Therefore, trench mask 210 and device isolation layer 120 may respectively be formed from materials having etching selectivities relative to one another. For example, trench mask 210 may be formed from silicon nitride, and device isolation layer 120 may be formed from silicon oxide.

Molding layer 220 is formed in a conformal manner on first and second lower silicon patterns 142 and 147 and device isolation layer 120. Molding layer 220 may be formed from a material having an etching selectivity relative to first and second lower silicon patterns 142 and 147. For example, molding layer 220 may be at least one layer selected from the group consisting of a silicon nitride layer, a silicon oxide nitride layer, a silicon oxide layer, and a metal nitride layer. Since, in the embodiment illustrated in FIGS. 9A through 9G, a thickness of molding layer 220 is a process parameter that at least contributes to determining a shape of a floating gate electrode 140 that is formed subsequently, the thickness of molding layer 220 may be controlled precisely. To precisely control the thickness of molding layer 220, a low pressure CVD or atomic layer deposition (ALD) technology can be used to form molding layer 220.

Figure 9E:
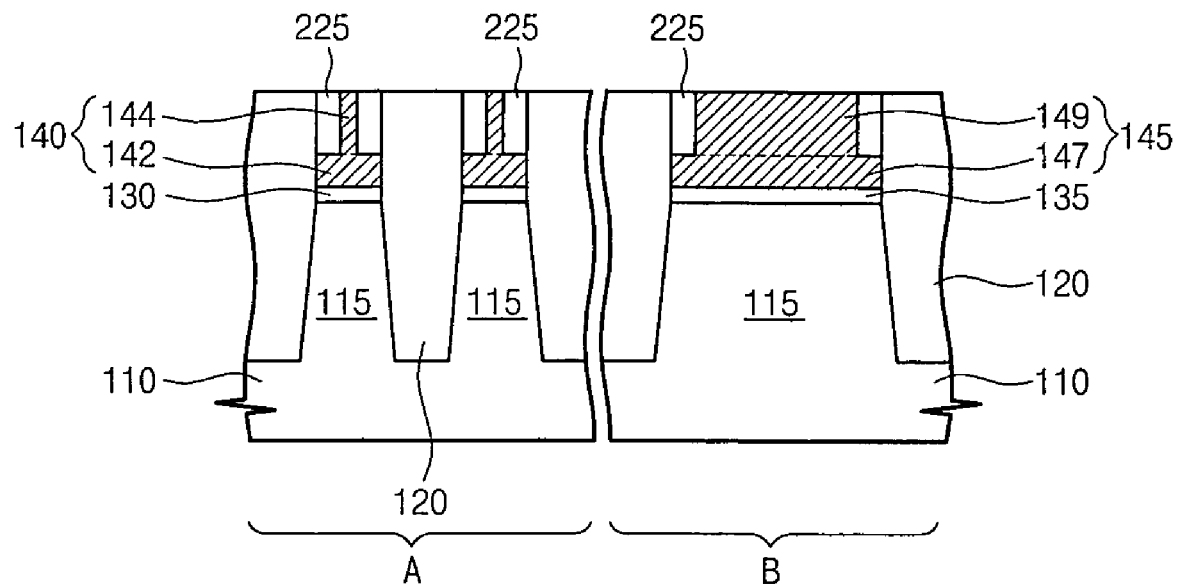

Referring to FIG. 9E, molding layer 220 is etched until upper surfaces of first and second lower silicon patterns 142 and 147 are exposed. An anisotropic etching process such as an etch-back process can be used to etch molding layer 220 until upper surfaces of first and second lower silicon patterns 142 and 147 are exposed. In the embodiment illustrated in FIGS. 9A through 9G, an anisotropic etching process is used, and through the anisotropic etching process, molding spacers 225 covering upper edges of first and second lower silicon patterns 142 and 147 are formed on upper sidewalls of device isolation layer 120. Subsequently, after a preliminary silicon pattern is formed by growing the preliminary silicon pattern from portions of first and second lower silicon patterns 142 and 147 exposed by molding spacers 225 (through a selective epitaxial growth process), a planarization process for exposing molding spacers 225 is performed to form first and second upper silicon patterns 144 and 149.

When first and second lower silicon patterns 142 and 147 are formed from polycrystal silicon, the selective epitaxial growth process may be performed under the following conditions, which are presented as exemplary conditions. A process temperature may be in a range of 600-650° C., and a process pressure may be in a range of 15-25 Pa. Also, fluxes of SiH$_4$ and Cl$_2$, which are process gases, may be in ranges of 80-90 sccm and 30-40 sccm, respectively. Through the selective epitaxial growth process, a floating gate electrode 140 having an inverse-"T"-shaped cross-section and comprising first lower silicon pattern 142 and first upper silicon pattern 144 is formed in cell region A. A peripheral circuit gate electrode 145 comprising second lower silicon pattern 147 and second upper silicon pattern 149 is formed in peripheral region B.

In accordance with the embodiment illustrated in FIGS. 9A through 9G, since first upper silicon pattern 144 is formed using molding spacer 225 as a mold, first upper silicon pattern 144 is automatically aligned at a central portion of first lower silicon pattern 142. Also, since selective epitaxial growth (i.e., epitaxial growth technology) is used, first upper silicon pattern 144 can be formed uniformly even when an interval between molding spacers 225 is narrow. That is, in accordance with the embodiment illustrated in FIGS. 9A through 9G, the formation of defects such as voids inside of first upper silicon pattern 144 is reduced. Also, second upper silicon pattern 149 can be formed on second lower silicon pattern 147 in peripheral region B without having to perform a separate, additional process. In addition, second upper silicon pattern 149 can substantially prevent pits from being etched in a portion of second active region 115 disposed below second lower silicon pattern 147.

Figure 9F:
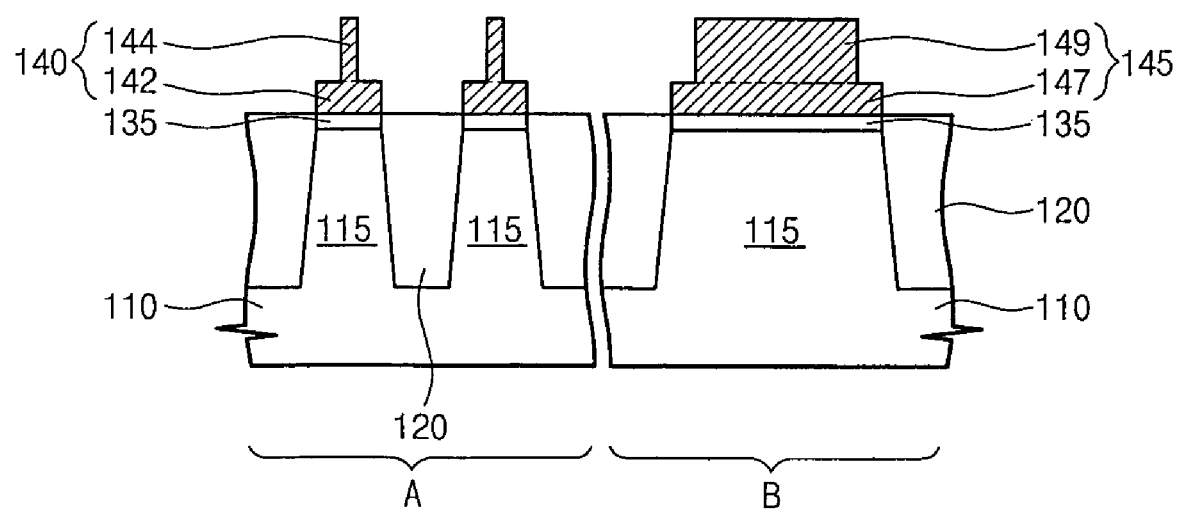

Referring to FIG. 9F, device isolation layer 120 is etched (i.e., recessed) by performing an etching process using first and second upper silicon patterns 144 and 149 and first and second lower silicon patterns 142 and 147 as an etch mask. Through that etching process, an upper surface of device isolation layer 120 is etched (i.e., lowered) down to lower surfaces of first and second lower silicon patterns 142 and 147 (i.e., etched such that upper surfaces of device isolation layer 120 are substantially level with lower surfaces of first and second lower silicon patterns 142 and 147). The further the upper surface of device isolation layer 120 is etched, the greater a coupling ratio between a floating gate electrode and a control gate electrode formed during a subsequent process will be; however, the etching process may cause damage to first and second gate insulating layers 130 and 135 when device isolation layer 120 is etched lower. Therefore, the conditions of the etching process for etching device isolation layer 120 are preferably determined in view of those considerations.

In the embodiment illustrated in FIGS. 9A through 9G, molding spacers 225 are removed while device isolation layer 120 is etched (i.e., recessed). Accordingly, portions of upper surfaces of first and second lower silicon patterns 142 and 147 not covered by first and second upper silicon patterns 144 and 149, respectively, are exposed. Alternatively, molding spacer 225 may be removed through performing an additional process rather than through the process of etching device isolation layer 120.

Figure 9G:
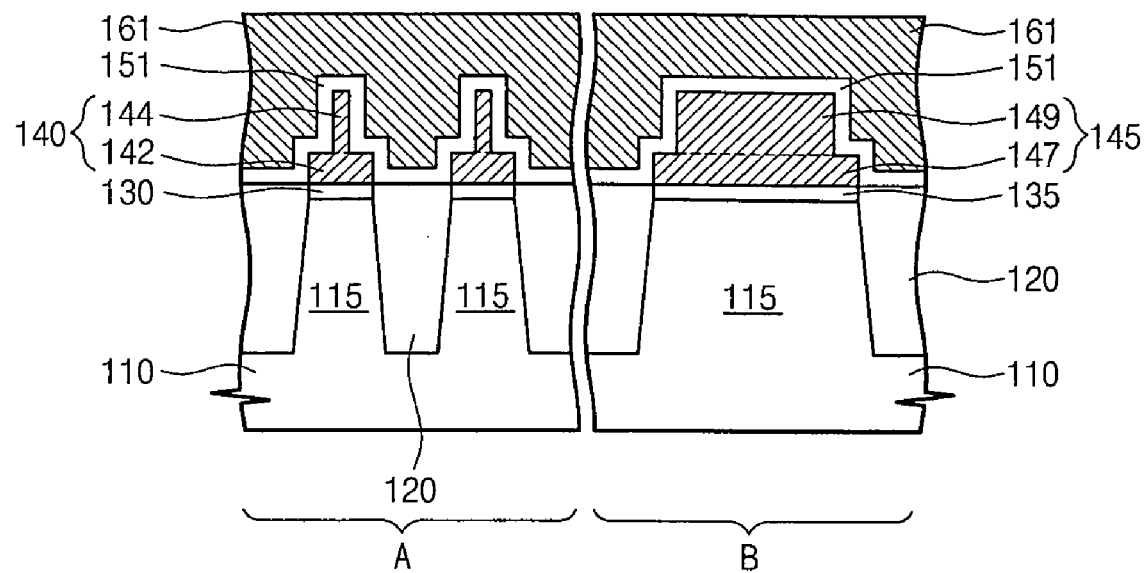

Referring to FIG. 9G, a preliminary inter-gate insulating layer 151 and a control gate conductive layer 161 each covering floating gate electrode 140 and peripheral circuit gate electrode 145 are formed on semiconductor substrate 110.

Preliminary inter-gate insulating layer 151 and control gate conductive layer 161 can be formed using a well-known thin film forming process. Preliminary inter-gate insulating layer 151 may be an oxide layer-nitride layer-oxide layer multiple layer or an aluminum oxide layer. Control gate conductive layer 161 may be formed from silicon or may be a stacked structure of silicon and silicide.

Subsequently, an etching process is performed in order to pattern control gate conductive layer 161 and preliminary inter-gate insulating layer 151 to form a control gate electrode 160 (i.e., a word line) and an inter-gate insulating layer 150 on floating gate electrode 140, and to remove the portions of pattern control gate conductive layer 161 and preliminary inter-gate insulating layer 151 formed on peripheral circuit gate electrode 145 disposed in peripheral region B. Also, an ion implantation process is performed to form source/drain regions on two sides of floating gate electrode 140, respectively, and in first active region 115, and to form source/drain regions on two sides of peripheral circuit gate electrode 145, respectively, and in second active region 115.

In the embodiment illustrated in FIGS. 9A through 9G, peripheral circuit gate electrode 145 may be formed through any one of a variety of methods. For example, control gate conductive layer 161, which is patterned during a subsequent process, can be connected to peripheral circuit gate electrode 145 by removing the portion of preliminary inter-gate insulating layer 151 formed on peripheral region B before forming control gate conductive layer 161, or by connecting peripheral circuit gate electrode 145 to control gate conductive layer 161 using a butting contact.

In accordance with the embodiment illustrated in FIGS. 9A through 9G, second upper silicon pattern 149 formed on second lower silicon pattern 147 can substantially prevent a portion of second active region 115 disposed below second lower silicon pattern 147 from being etched during an etching process (i.e., substantially prevent pits from being generated, during an etching process, in a portion of second active region 115 disposed below second lower silicon pattern 147).

Figure 10A:
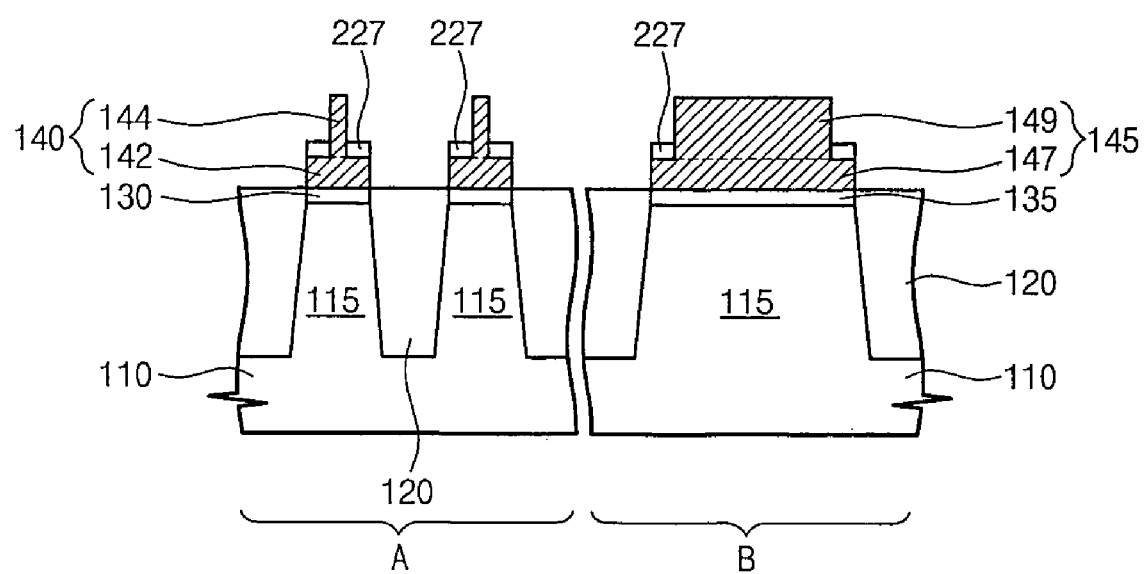
FIGS. 10A and 10B are cross-sectional views illustrating a method for forming a semiconductor device in accordance with another embodiment of the invention.
Figure 10B:
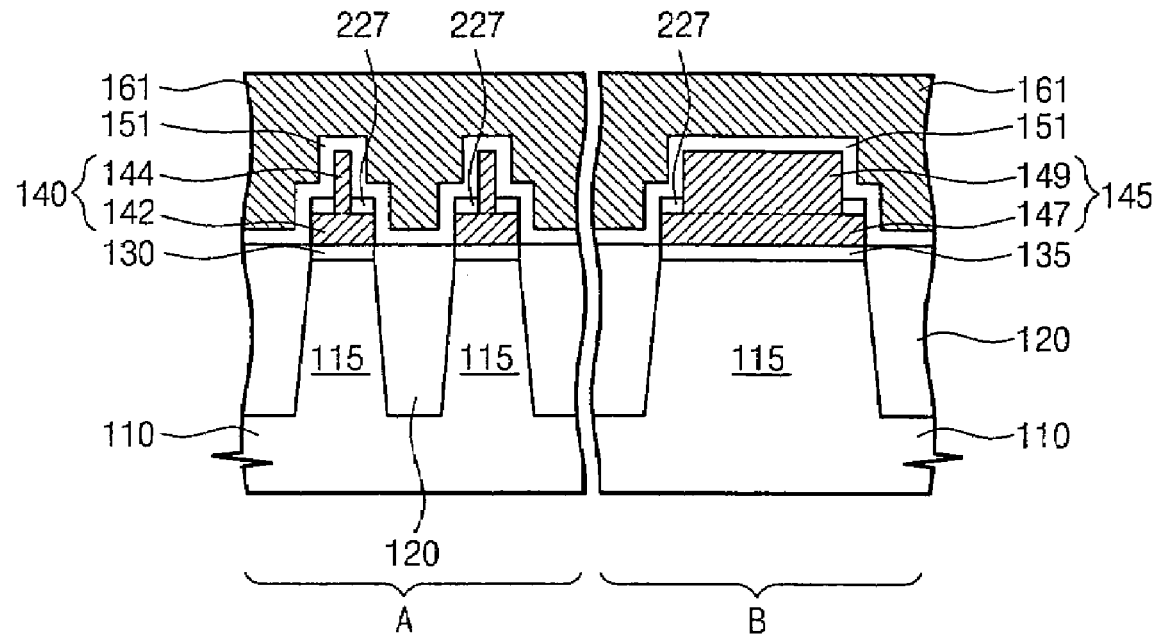

FIGS. 10A and 10B are cross-sectional views illustrating a method for forming a semiconductor device in accordance with another embodiment of the invention.

Referring to FIGS. 10A and 10B, buffer insulating layer patterns 227 are formed by not completely removing molding spacers 225 of FIG. 9E, but leaving portions of molding spacers 225 (wherein each portion has a predetermined thickness) on first and second lower silicon patterns 142 and 147 before forming preliminary inter-gate insulating layer 151. Buffer insulating layer patterns 227 protect second lower silicon pattern 147 and/or first lower silicon pattern 142 disposed below buffer insulating layer patterns 227 during the etching process for patterning at least one of control gate conductive layer 161, preliminary inter-gate insulating layer 151, and floating gate electrode 140.

In the embodiment illustrated in FIGS. 10A and 10B, since a cross-section of each of floating gate electrode 140 and peripheral circuit gate electrode 145 has an inverse-"T" shape, the central portion of floating gate electrode 140 is thicker than each of the edges of floating gate electrode 140 by an amount equal to the height of first upper silicon pattern 144, and the central portion of peripheral circuit gate electrode 145 is thicker than each of the edges of peripheral circuit gate electrode 145 by an amount equal to the height of second upper silicon pattern 149. However, buffer insulating layer patterns 227 formed on upper portions of first lower silicon pattern 142 where first upper silicon pattern 144 is not formed, and formed on upper portions of second lower silicon pattern 147 where second upper silicon pattern 149 is not formed, serve as an etch stop layer to protect first lower silicon pattern 142 and/or second lower silicon pattern 147 when first upper silicon pattern 144 and/or second upper silicon pattern 149 is etched during the etching process for patterning control gate conductive layer 161 and preliminary inter-gate insulating layer 151. Thus, the thinnest portions of floating gate electrode 140 and/or the thinnest portions of peripheral circuit gate electrode 145 (i.e., the edge portions of peripheral circuit gate electrode 145) are not removed, so the portion of first active region 115 disposed below floating gate electrode 140 and/or the portion of second active region 115 disposed below peripheral circuit gate electrode 145 is not etched (i.e., pits are not generated in that region) during the etching process mentioned above.

Figure 11A:
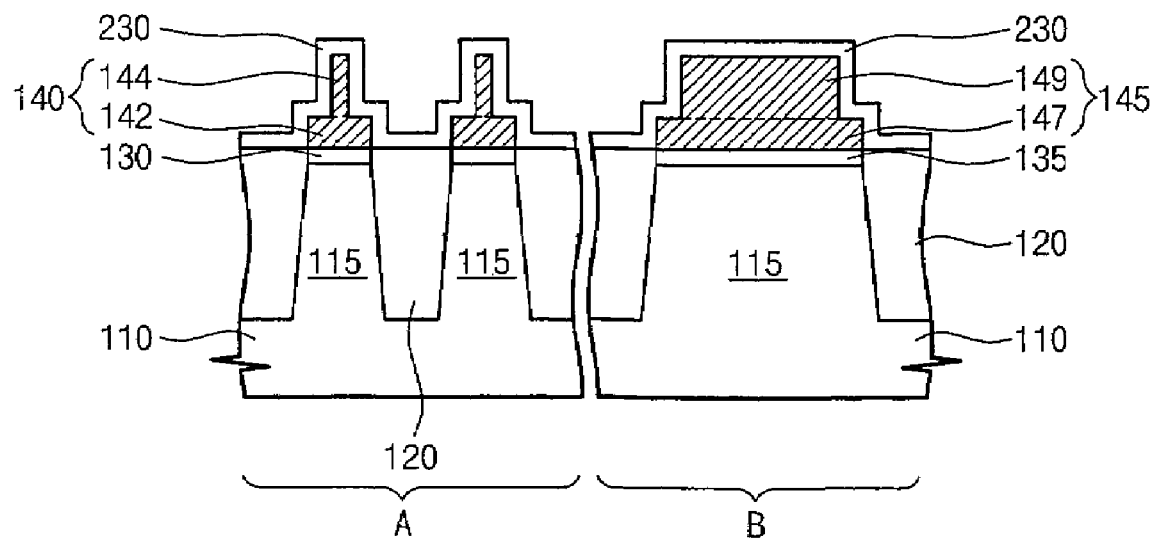
FIGS. 11A and 11B are cross-sectional views illustrating a method for forming a semiconductor device in accordance with another embodiment of the invention.
Figure 11B:
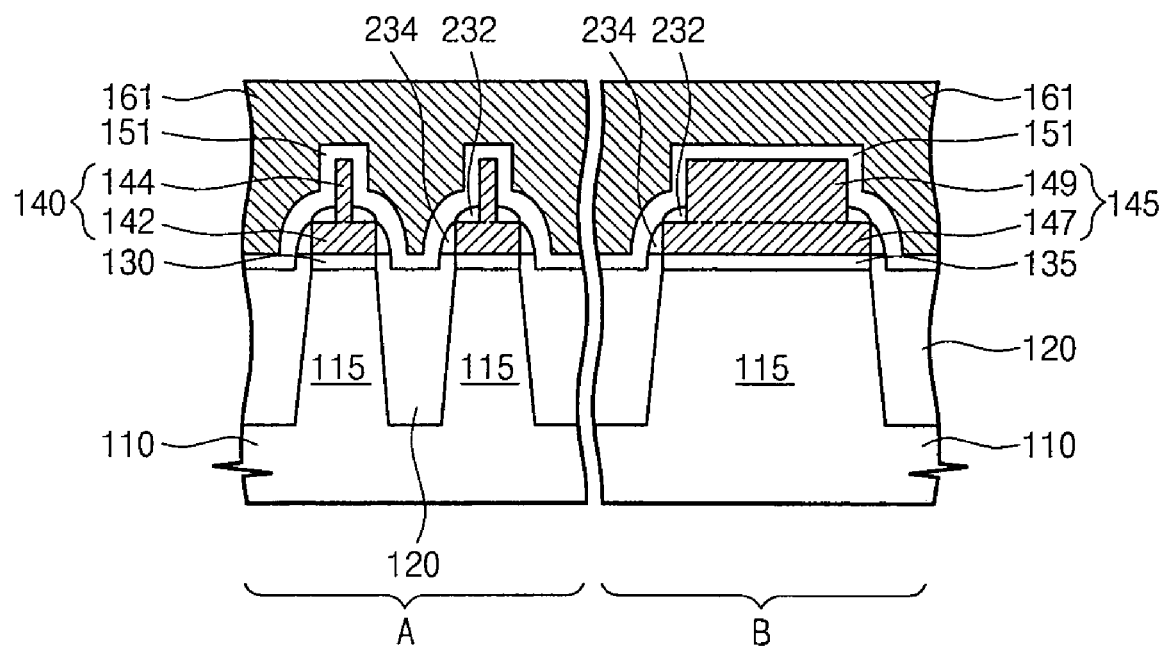

FIGS. 11A and 11B are cross-sectional views illustrating a method for forming a semiconductor device in accordance with another embodiment of the invention.

Referring to FIG. 9F, device isolation layer 120 is etched; however, it is not etched to a depth at which a first gate insulating layer 130 or a second gate insulating layer 135 would be exposed. Referring to FIGS. 11A and 11B, after the etching illustrated in FIG. 9F is performed, a buffer insulating layer 230 covering floating gate electrode 140 is formed in a conformal manner on semiconductor substrate 110. Subsequently, buffer insulating layer 230 is anisotropically etched until upper surfaces of first and second upper silicon patterns 144 and 149 are exposed. Buffer insulating layer 230 may be at least one selected from the group consisting of a silicon oxide layer, a silicon nitride layer, a silicon oxide nitride layer, and a metal nitride layer.

Accordingly, buffer insulating layer patterns 232 are formed on upper surfaces of first and second lower silicon patterns 142 and 147, and buffer spacers 234 are formed on sidewalls of first and second lower silicon patterns 142 and 147. Then, device isolation layer 120 is etched (i.e., recessed) such that the upper surfaces of first portions of device isolation layer 120 are disposed lower than a bottom surface of floating gate electrode 140 and lower than a bottom surface of peripheral circuit gate electrode 145, wherein the first portions of device isolation layer 120 are disposed between buffer spacers 234 as illustrated in FIG. 11B. A preliminary inter-gate insulating layer 151 and a control gate conductive layer 161 are then formed on semiconductor substrate 110, including on buffer insulating layer patterns 232 and buffer spacers 234. Consequently, buffer insulating layer patterns 232 are interposed between upper surfaces of first and second lower silicon patterns 142 and 147 and preliminary inter-gate insulating layer 151. Subsequently, preliminary inter-gate insulating layer 151 and control gate conductive layer 161 are patterned to form a word line extending over first active region 115 and portions of device isolation layer 120. A process for forming the word line is the same as in previously described embodiments. Because device isolation layer 120 is etched such that upper surfaces of the first portions of device isolation layer 120 are disposed lower than a bottom surface of floating gate electrode 140, forming and patterning preliminary inter-gate insulating layer 151 and control gate conductive layer 161 to form a word line comprising a control gate electrode 160 and extending over first active region 115 and portions of device isolation layer 120 forms a control gate electrode 160 similar to the control gate electrode 160 of FIG. 6, but with at least a portion of a lower surface disposed lower than a bottom (i.e., lower) surface of floating gate electrode 140.

Similar to the embodiment illustrated in FIGS. 10A and 10B, when buffer insulating layer patterns 232 are used, a problem of first lower silicon pattern 142 and/or second lower silicon pattern 147 being etched when first upper silicon pattern 144 and/or second upper silicon pattern 149 is etched during the etching process for forming floating gate electrode 140 and/or control gate electrode 160 can be substantially prevented. Also, buffer spacers 234 are interposed between sidewalls of first and second lower silicon patterns 142 and 147 and preliminary inter-gate insulating layer 151, so a problem of first gate insulating layer 130 and/or second gate insulating layer 135 being exposed when etching preliminary inter-gate insulating layer 151 and control gate conductive layer 161 can be substantially prevented. Also, in the embodiment illustrated in FIGS. 11A and 11B, before preliminary inter-gate insulating layer 151 is formed, buffer spacers 234 may be removed using an etching recipe having an etching selectivity between buffer spacers 234 and device isolation layer 120.

Figure 12A:
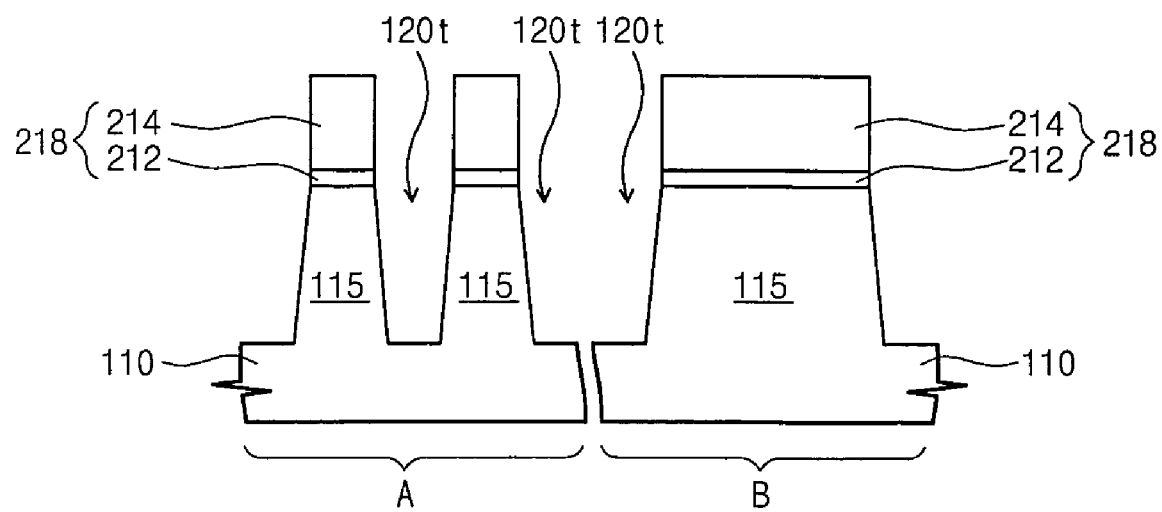
FIGS. 12A through 12G are cross-sectional views illustrating a method for forming a semiconductor device in accordance with another embodiment of the invention.
Figure 12B:
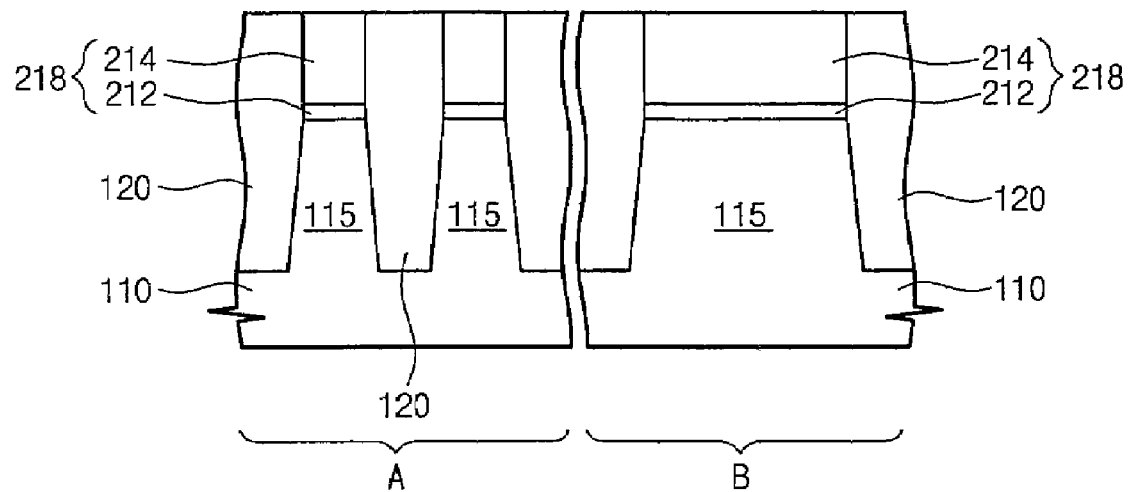
Figure 12C:
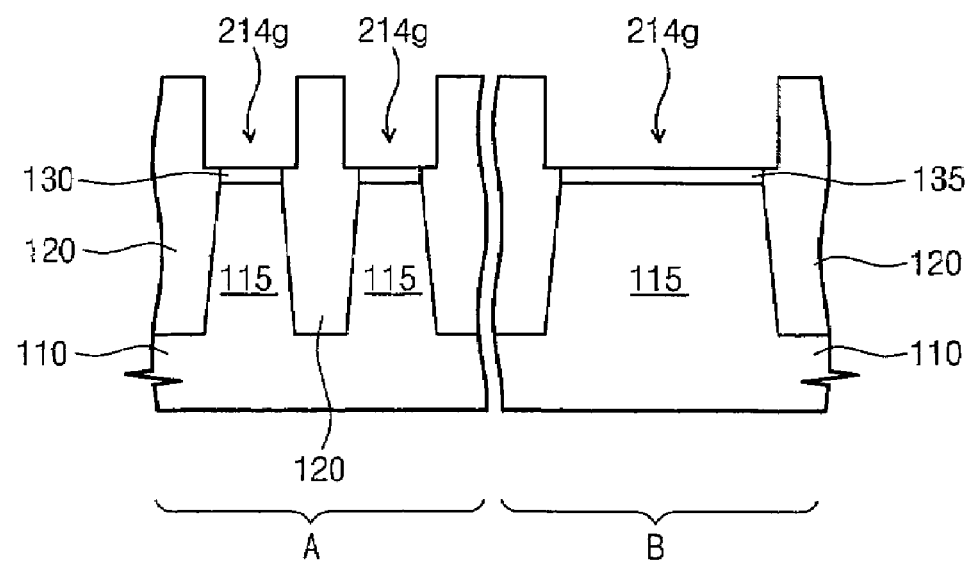
Figure 12D:
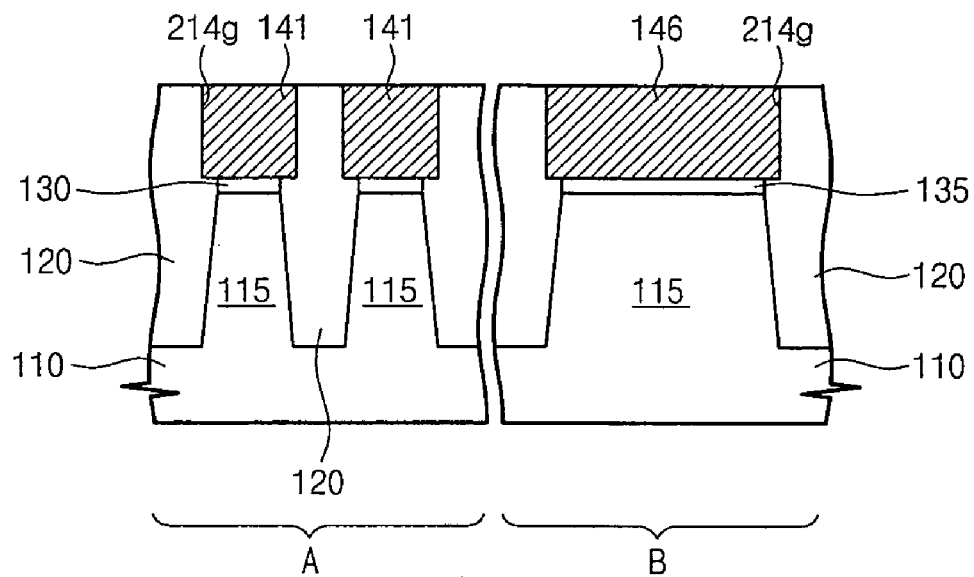
Figure 12E:
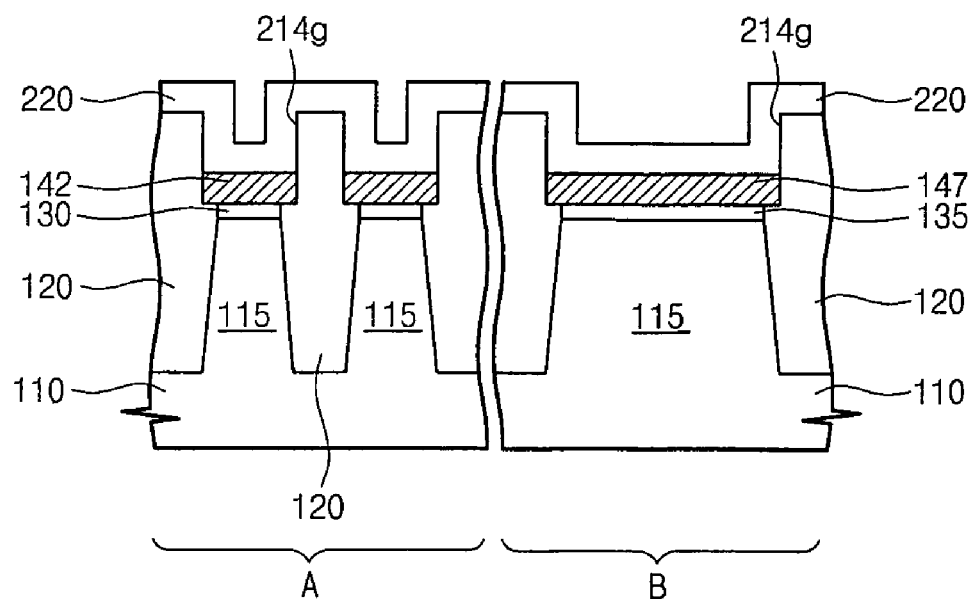
Figure 12F:
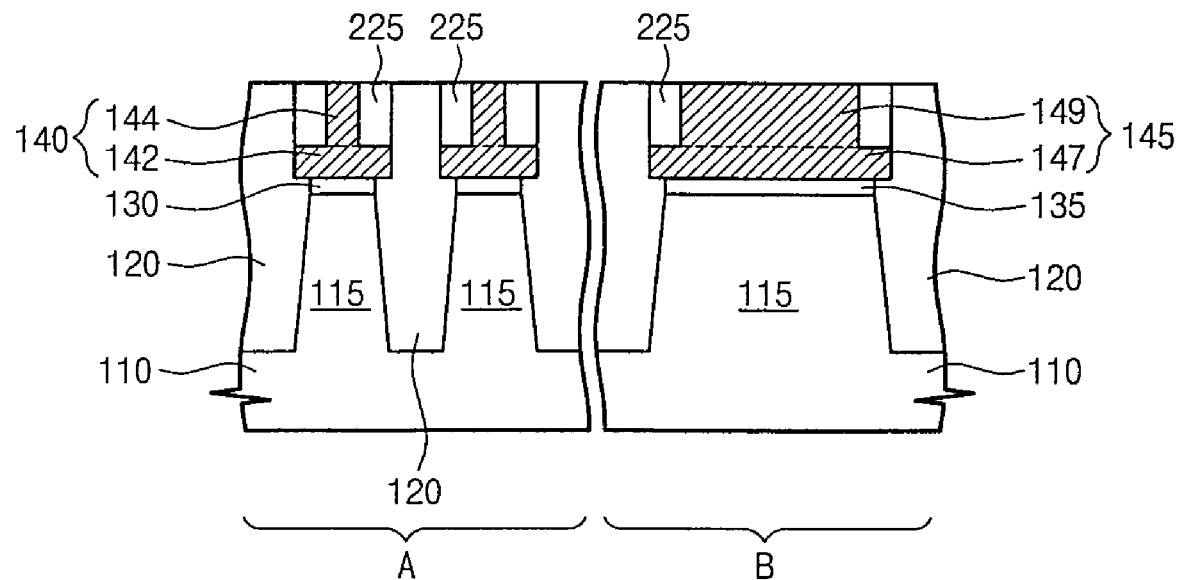
Figure 12G:
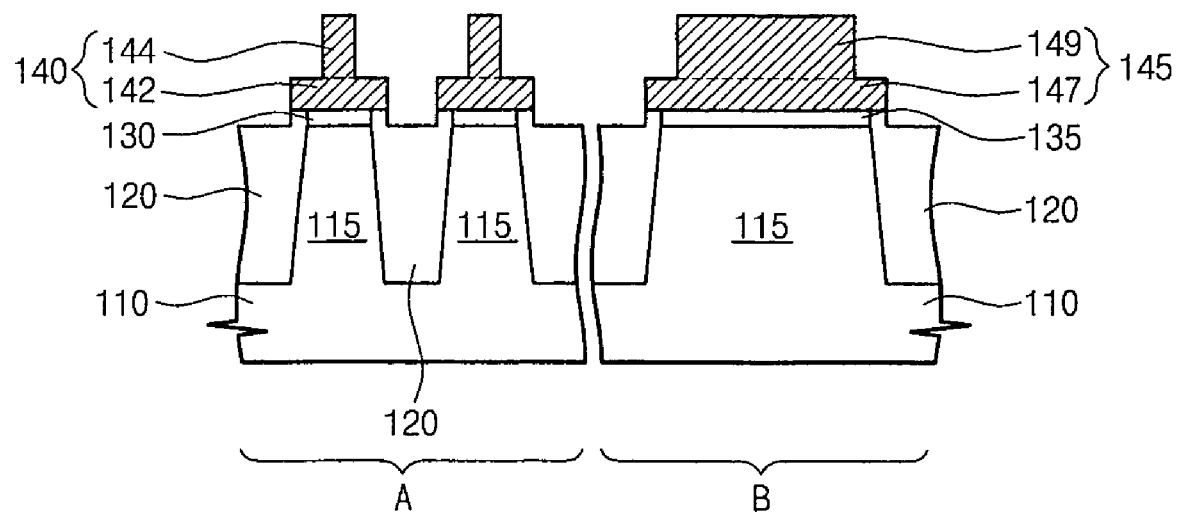

FIGS. 12A and 12G are cross-sectional views illustrating a method for forming a semiconductor device in accordance with another embodiment of the invention.

Referring to FIG. 12A, a trench mask 218 is formed on a predetermined region of semiconductor substrate 110. Trench mask 218 can be a multiple layer comprising a pad oxide layer 212 and a mask nitride layer 214. Also, trench mask 218 can further comprise a silicon nitride layer (e.g., a medium temperature oxide (MTO) layer) and an antireflection layer formed on mask nitride layer 214. In addition, the type, thickness, and stacking order of trench mask 218 can be modified in various ways.

Trenches 120t defining first and second active regions 115 of a semiconductor substrate 110 are formed by performing an etching process using trench mask 210 as an etch mask. The etching process can be performed using a method of anisotropic etching semiconductor substrate 110 using an etching recipe having an etching selectivity between semiconductor substrate 110 and trench mask 218.

Referring to FIG. 12B, after a preliminary device isolation layer filling trenches 120t is formed, a planarization process for exposing an upper surface of trench mask 218 is performed to form a device isolation layer 120.

Referring to FIG. 12C, an etching process is performed to remove trench mask 218 and form gap regions 214g exposing upper surfaces of first and second active regions 115. The etching process may comprise removing mask nitride layer 214 using an etching recipe having an etching selectivity between device isolation layer 120 and mask nitride layer 214, and removing pad oxide layer 212 using an etching recipe having an etching selectivity between semiconductor substrate 110 and pad oxide layer 212.

In addition, the exposed sidewalls of device isolation layer 120 may be etched horizontally while removing of pad oxide layer 212, thereby making each region 214g wider than the active region 115 over which it is disposed. In accordance with the embodiment illustrated in FIGS. 12A through 12G, since device isolation layer 120 is formed from the same material as pad oxide layer 212 (i.e., a silicon oxide), the respective widths of gap regions 214g can be extended without having to perform a separate process. Extending the width of gap regions 214g not only makes a floating gate electrode 140 (which will be formed subsequently) wider than it would be otherwise, but also reduces a problem of damaging first and second gate insulating layers 130 and 135 during a subsequent process of etching (i.e., recessing) an upper surface of device isolation layer 120 (see FIG. 12G). Floating gate electrode 140, which will be formed subsequently, is a floating gate electrode of a nonvolatile memory device.

Once gap regions 214g have been formed (i.e., completed), first gate insulating layers 130 are formed on portions of exposed upper surfaces of first active regions 115 and a second gate insulating layer 135 is formed on a portion of an exposed upper surface of a first active region 115. First and second gate insulating layers 130 and 135 can be formed from silicon oxide or a metal insulator having a high dielectric constant through a thermal oxidation process.

Referring to FIG. 12D, after a preliminary device isolation layer filling extended gap regions 214g is formed, a planarization process for exposing an upper surface of device isolation layer 120 is performed to form first and second lower silicon layers 141 and 146. Each of first and second lower silicon layers 141 and 146 may be formed from single crystal silicon or polycrystal silicon. Because each gap region 214g was widened, each of first and second lower silicon layers 141 and 146 is wider than the active region 115 on which it is disposed.

First and second lower silicon layers 141 and 146 can be formed using a well-known thin film forming process, e.g., a CVD process. During the planarization process, a CVD technology that uses an etching recipe having an etching selectivity between device isolation layer 120 and the preliminary device isolation layer can be used. The slurry used during the planarization process preferably comprises a material that can provide an etching characteristic (i.e., a large etching selectivity) to the slurry that will make the slurry have an etching speed for silicon that is greater than its etching speed for a silicon oxide layer.

Referring to FIG. 12E, an etching process is performed to remove upper portions of first and second lower silicon patterns 141 and 146, and to form a first lower silicon pattern 142 in a gap region 214g disposed over first active region 115 and a second lower silicon pattern 147 in a gap region 214g disposed over second active region 115. The etching process may be an anisotropic etching process using an etching recipe having etching selectivity between device isolation layer 120 and first and second lower silicon patterns 141 and 146. Each of first and second lower silicon layers 141 and 146 is etched such that its upper surface is disposed below upper surfaces of device isolation layer 120 and above the bottom surface of the gap region 214g in which it is disposed. Accordingly, for each of first and second lower silicon patterns 142 and 147, the lower silicon pattern is formed in the lower portion of a gap region 214g and upper sidewalls of device isolation layer 120 are exposed in that gap region 214g.

Subsequently, a molding layer 220 is formed in a conformal manner on semiconductor substrate 110 on which first and second lower silicon patterns 142 and 147 are formed. Molding layer 220 can be formed from a material having an etching selectivity relative to first and second lower silicon patterns 142 and 147. For example, molding layer 220 can be at least one selected from the group consisting of a silicon nitride layer, a silicon oxide nitride layer, a silicon oxide layer, and a metal nitride layer. Since, in accordance with at least one embodiment of the invention, a thickness of molding layer 220 is a process parameter that determines a shape of a subsequently formed floating gate electrode, the thickness of molding layer 220 is preferably controlled precisely. For this purpose, a low pressure CVD or an atomic layer deposition (ALD) technology can be used. In addition, it is also preferable to precisely control the thickness of each of first and second lower silicon layers 141 and 146 because the depth to which each of first and second lower silicon layers 141 and 146 is etched and the height of an exposed sidewall of device isolation layer 120 are process parameters that influence the shape of a subsequently formed floating gate electrode.

Referring to FIG. 12F, molding layer 220 is etched until upper surfaces of first and second lower silicon patterns 142 and 147 are exposed. An anisotropic etching process such as an etch-back process can be used to etch molding layer 220. Through the anisotropic etching process, molding spacers 225 covering upper edges of lower silicon patterns 142 and 147 are formed. Each of molding spacers 225 is also adjacent to the upper sidewall of a device isolation layer 120. Subsequently, after a preliminary silicon pattern is grown from portions of lower silicon patterns 142 and 147 exposed by (i.e., between) molding spacers 225 (through a selective epitaxial growth process), a planarization process for exposing molding spacers 225 is performed in order to form first and second upper silicon patterns 144 and 149. Through the process described above, a floating gate electrode 140 having a inverse-"T"-shaped cross-section and comprising first lower silicon pattern 142 and first upper silicon pattern 144 is formed in cell region A, and a peripheral circuit gate electrode 145 comprising second lower silicon pattern 147 and second upper silicon pattern 149 is formed in peripheral region B.

Referring to FIG. 12G, device isolation layer 120 is etched (i.e., recessed) by performing an etching process using first and second upper silicon patterns 144 and 149 and first and second lower silicon patterns 142 and 147 as an etch mask.

In accordance with the embodiment illustrated in FIGS. 12A through 12G, since first and second gate insulating layers 130 and 135 are protected by first and second lower silicon patterns 142 and 147, an upper surface of device isolation layer 120 can be etched so that it is lower than the upper surfaces of first and second gate insulating layers 130 and 135. With the structure described above, a coupling ratio of a floating gate electrode and a control gate electrode formed during a subsequent process may increase, and parasitic capacitance between adjacent floating gate electrodes may decrease.

Figure 13A:
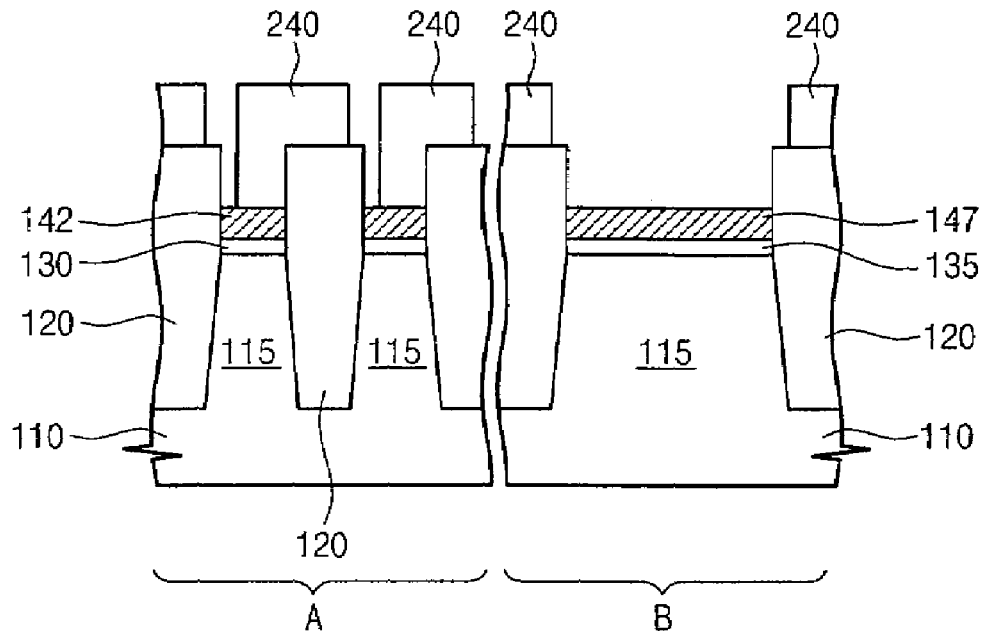
FIGS. 13A and 13B are cross-sectional views illustrating a method for forming a semiconductor device in accordance with another embodiment of the invention.
Figure 13B:
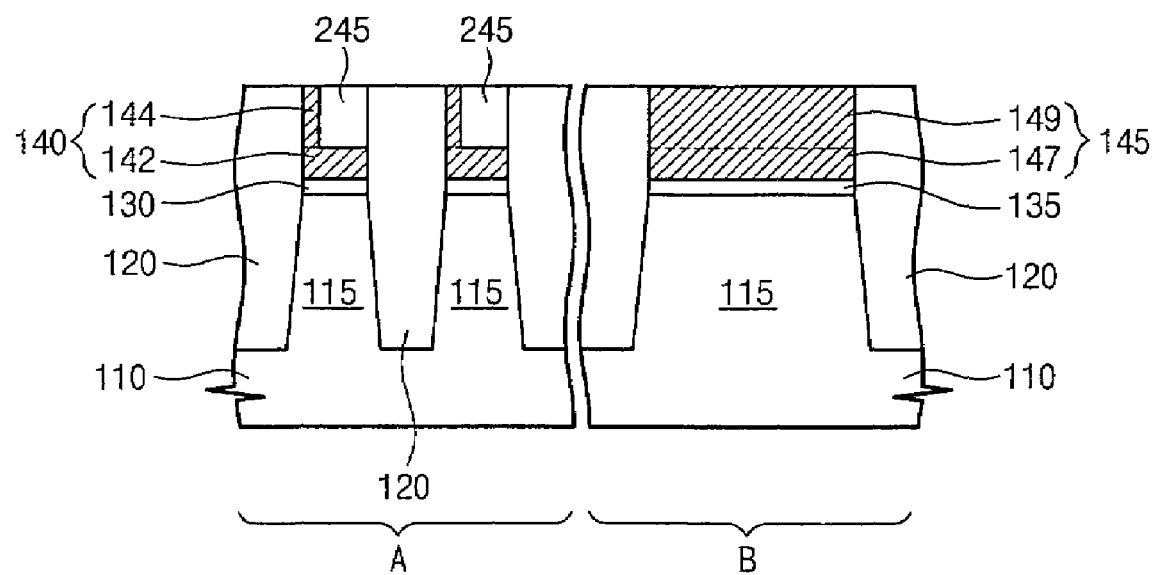

FIGS. 13A and 13B are cross-sectional views illustrating a method for forming a semiconductor device in accordance with another embodiment of the invention. A process similar to a previously-described process for forming first and second lower silicon patterns 142 and 147 corresponding to a previously-described embodiment can also be used in the embodiment illustrated in FIGS. 13A and 13B. For example, the method described with reference to FIGS. 13A and 13B may be performed after forming an intermediate structure such as the intermediate structure illustrated in FIG. 9C, but with trench mask 210 removed. Therefore, only a process for forming first and second upper silicon patterns 144 and 149 will be described with reference to the embodiment illustrated in FIGS. 13A and 13B.

Referring to FIG. 13A, a molding mask 240 is formed on a semiconductor substrate 110 on which first and second lower silicon patterns 142 and 147 are formed. A portion of an upper surface of first lower silicon pattern 142 is exposed by molding mask 240 in a cell region A of semiconductor substrate 110. All of an upper surface of second lower silicon pattern 147 is exposed in a peripheral region B of semiconductor substrate 110.

Referring to FIG. 13B, after a preliminary upper silicon pattern is grown from the exposed portions of first and second lower silicon patterns 142 and 147, a planarization process for exposing an upper surface of device isolation layer 120 is performed to form first and second upper silicon patterns 144 and 149. Also, the planarization process forms spacers 245, wherein each spacer is adjacent to an upper sidewall of a device isolation layer 120.

In accordance with the embodiment illustrated in FIGS. 13A and 13B, second upper silicon pattern 149 can be formed to have the same width as second lower silicon pattern 147. Therefore, while a subsequent etching process for forming a control gate electrode is performed, second upper silicon pattern 149 formed on second lower silicon pattern 147 can substantially prevent the etching of (i.e., the generation of pits in) a portion of a second active region 115 disposed below second lower silicon pattern 147. Also, since an epitaxial growth technology is used (i.e., selective epitaxial growth), first upper silicon pattern 144 can be formed uniformly even when an interval between a device isolation layer 120 and a portion of molding mask 240 (see FIG. 13A) is relatively narrow. In accordance with the embodiment illustrated in FIGS. 13A and 13B, so that parasitic capacitance between adjacent floating gate electrodes 140 can be minimized, floating gate electrodes 140 aligned in a word line direction (i.e., a direction extending horizontally between left and right sides of FIG. 13B) have the same shape (i.e., either an "⌐"-shaped cross-section or a "⌐"-shaped cross-section), but floating gate electrodes 140 aligned in a direction in which a first active region 115 extends (e.g., aligned in a direction extending perpendicularly into the page of FIG. 13B) alternate between floating gate electrodes 140 having "⌐"-shaped cross-sections and floating gate electrodes 140 having "⌐"-shaped cross-sections.

In accordance with embodiments of the invention, the problem of pits being etched in a second active region disposed below the second lower silicon pattern in the peripheral region by the etching process performed to form a control gate electrode can be reduced by the second upper silicon pattern, in accordance with embodiments of the invention, which is formed on the second lower silicon pattern disposed in the peripheral region.

Also, in accordance with embodiments of the invention, the upper silicon pattern can be uniformly formed using epitaxial growth technology (e.g., selective epitaxial growth). Therefore, even when a design rule decreases, upper silicon patterns can be formed in a way that substantially prevents defects such as voids from being generated inside of the upper silicon patterns when they are formed.

Therefore, reliability and operational characteristics of a semiconductor device in accordance with an embodiment of the invention may improve.

Although embodiments of the invention have been described herein, one of ordinary skill in the art may modify the embodiments described above without departing from the scope of the invention as defined by the accompanying claims.

What is claimed is:

1. A semiconductor device comprising:
a memory cell transistor disposed in a cell region of a semiconductor substrate, the memory cell transistor comprising:
a floating gate electrode disposed on a first active region of the semiconductor substrate and comprising a first lower silicon pattern and a first upper silicon pattern;
a first gate insulating layer disposed between the first active region and the floating gate electrode;
a control gate electrode disposed on the floating gate electrode, the first active region, and the device isolation layer; and
an inter-gate insulating layer disposed between the floating gate electrode and the control gate electrode; and
a peripheral circuit transistor disposed in a peripheral region of the semiconductor substrate, the peripheral circuit transistor comprising:
a peripheral circuit gate electrode disposed on a second active region of the semiconductor substrate and comprising a second lower silicon pattern and a second upper silicon pattern,
wherein the second upper silicon pattern has a uniform thickness and the second lower silicon pattern is wider than the second silicon pattern; and
a second gate insulating layer disposed between the second active region and the peripheral circuit gate electrode.

2. The semiconductor device of claim 1, wherein the first lower silicon pattern is wider than the first upper silicon pattern.

3. The semiconductor device of claim 1, wherein the first lower silicon pattern is as wide as or wider than the first active region and the second lower silicon pattern is as wide as or wider than the second active region.

4. The semiconductor device of claim 1, further comprising a buffer insulating layer pattern disposed between an upper surface of the first lower silicon pattern and the inter-gate insulating layer, wherein the buffer insulating layer pattern is thinner than the first upper silicon pattern.

5. The semiconductor device of claim 4, further comprising a buffer spacer disposed between a sidewall of the first lower silicon pattern and the inter-gate insulating layer.

6. The semiconductor device of claim 1, wherein at least a portion of a lower surface of the control gate electrode is disposed lower than a lower surface of the floating gate electrode.

7. A semiconductor device comprising:
a memory cell transistor disposed in a cell region of a semiconductor substrate, the memory cell transistor comprising:
a floating gate electrode disposed on a first active region of the semiconductor substrate and comprising a first lower silicon pattern and a first upper silicon pattern;
a first gate insulating layer disposed between the first active region and the floating gate electrode;
a buffer insulating layer pattern disposed on an upper surface of the first lower silicon pattern, wherein the buffer insulating layer pattern is thinner than the first upper silicon pattern; and
a buffer spacer disposed on a sidewall of the first lower silicon pattern; and
a peripheral circuit transistor disposed in a peripheral region of the semiconductor substrate, the peripheral circuit transistor comprising:
a peripheral circuit gate electrode disposed on a second active region of the semiconductor substrate and comprising a second lower silicon pattern and a second upper silicon pattern, wherein the second upper silicon pattern has a uniform thickness, and the second lower silicon pattern is wider than the second upper silicon pattern; and
a second gate insulating layer disposed between the second active region and the peripheral circuit gate electrode.

8. The semiconductor device of claim 7, wherein the first lower silicon pattern is wider than the first upper silicon pattern.

9. The semiconductor device of claim 7, wherein the memory cell transistor further comprising:
a control gate electrode disposed on the floating gate electrode, the first active region, and the device isolation layer; and
an inter-gate insulating layer disposed between the floating gate electrode and the control gate electrode.

10. The semiconductor device of claim 7, wherein the first lower silicon pattern is as wide as or wider than the first active region and the second lower silicon pattern is as wide as or wider than the second active region.

11. The semiconductor device of claim 7, wherein at least a portion of a lower surface of the control gate electrode is disposed lower than a lower surface of the floating gate electrode.

* * * * *